(12) United States Patent
Hasan et al.

(10) Patent No.: US 12,527,078 B2
(45) Date of Patent: Jan. 13, 2026

(54) GATE-ALL-AROUND INTEGRATED CIRCUIT STRUCTURES HAVING EPITAXIAL SOURCE OR DRAIN REGION LATERAL ISOLATION

(71) Applicant: Intel Corporation, Santa Clara, CA (US)

(72) Inventors: Mohammad Hasan, Aloha, OR (US); Mohit K. Haran, Hillsboro, OR (US); Leonard P. Guler, Hillsboro, OR (US); Pratik Patel, Portland, OR (US); Tahir Ghani, Portland, OR (US); Anand S. Murthy, Portland, OR (US); Makram Abd El Qader, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 17/558,026

(22) Filed: Dec. 21, 2021

(65) Prior Publication Data

US 2023/0197722 A1    Jun. 22, 2023

(51) Int. Cl.
*H10D 84/85*    (2025.01)
*H01L 21/02*    (2006.01)
(Continued)

(52) U.S. Cl.
CPC ....... *H10D 84/85* (2025.01); *H01L 21/02603* (2013.01); *H10D 30/014* (2025.01);
(Continued)

(58) Field of Classification Search
CPC .... H10D 84/85; H10D 30/014; H10D 30/031; H01L 21/02603
See application file for complete search history.

(56) References Cited

U.S. PATENT DOCUMENTS 9,520,363 B1 * 12/2016 Cheng .................... H10D 84/85
9,837,414 B1 * 12/2017 Balakrishnan ..... H10D 84/0172
(Continued)

FOREIGN PATENT DOCUMENTS

CN    110943082 A  *  3/2020  ......... H10D 84/0193
CN    116266590 A  *  6/2023  ......... H10D 30/6735
(Continued)

OTHER PUBLICATIONS

Search Report from International Patent Application No. PCT/US2022/049985, mailed Apr. 3, 2023, 10 pgs.
(Continued)

*Primary Examiner* — Laura M Menz
(74) *Attorney, Agent, or Firm* — Schwabe, Williamson & Wyatt P.C.

(57) ABSTRACT

Gate-all-around integrated circuit structures having epitaxial source or drain region lateral isolation are described. For example, an integrated circuit structure includes a first vertical arrangement of nanowires and a second vertical arrangement of nanowires. A gate stack is over the first and second vertical arrangements of nanowires. First epitaxial source or drain structures are at ends of the first vertical arrangement of nanowires. Second epitaxial source or drain structures are at ends of the second vertical arrangement of nanowires. An intervening dielectric structure is between neighboring ones of the first epitaxial source or drain structures and the second epitaxial source or drain structures. The intervening dielectric structure has a top surface co-planar with a top surface of the gate structure.

10 Claims, 14 Drawing Sheets

(51) Int. Cl.
  *H10D 30/01*    (2025.01)
  *H10D 30/43*    (2025.01)
  *H10D 30/67*    (2025.01)
  *H10D 62/10*    (2025.01)
  *H10D 64/01*    (2025.01)
  *H10D 84/01*    (2025.01)
  *H10D 84/03*    (2025.01)

(52) U.S. Cl.
  CPC ......... *H10D 30/031* (2025.01); *H10D 30/43* (2025.01); *H10D 30/6713* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/038* (2025.01)

(56) References Cited

U.S. PATENT DOCUMENTS

| | | | | |
|---|---|---|---|---|
| 9,870,958 | B2* | 1/2018 | Cheng | H01L 21/76895 |
| 11,101,268 | B2* | 8/2021 | Jambunathan | H10D 84/853 |
| 11,329,162 | B2* | 5/2022 | Kobrinsky | H10D 30/6713 |
| 11,398,474 | B2* | 7/2022 | Guler | H10D 64/512 |
| 11,462,536 | B2* | 10/2022 | Bowonder | H10D 62/115 |
| 11,527,609 | B2* | 12/2022 | Su | H10D 62/121 |
| 11,621,354 | B2* | 4/2023 | Kobrinsky | H10D 84/017 257/351 |
| 11,626,494 | B2* | 4/2023 | Chu | H10D 30/6735 257/347 |
| 11,658,220 | B2* | 5/2023 | Su | H10D 62/151 257/401 |
| 11,664,379 | B2* | 5/2023 | Lee | H10D 30/62 257/369 |
| 11,742,346 | B2* | 8/2023 | Lilak | H10D 88/01 257/369 |
| 11,756,996 | B2* | 9/2023 | Ando | H10D 30/43 257/288 |
| 11,862,635 | B2* | 1/2024 | Guler | H10D 84/83 |
| 11,869,889 | B2* | 1/2024 | Liao | H10D 84/0193 |
| 11,948,973 | B2* | 4/2024 | Chiang | H10D 84/665 |
| 12,009,266 | B2* | 6/2024 | Chen | H01L 21/764 |
| 12,027,585 | B2* | 7/2024 | Bomberger | H10D 64/01 |
| 12,107,085 | B2* | 10/2024 | Lilak | H01L 23/481 |
| 12,148,795 | B2* | 11/2024 | Su | H10D 62/151 |
| 12,266,708 | B2* | 4/2025 | Guler | H10D 30/6757 |
| 12,272,727 | B2* | 4/2025 | Bomberger | H10D 30/014 |
| 12,272,737 | B2* | 4/2025 | Guha | H10D 84/834 |
| 12,342,612 | B2* | 6/2025 | Guler | H10D 64/021 |
| 2017/0053918 | A1* | 2/2017 | Cheng | H10D 64/251 |
| 2019/0326395 | A1* | 10/2019 | Ando | H10D 64/017 |
| 2019/0355721 | A1* | 11/2019 | Jambunathan | H10D 30/024 |
| 2020/0006329 | A1* | 1/2020 | Lilak | H10D 84/08 |
| 2020/0075770 | A1* | 3/2020 | Kobrinsky | H10D 30/6757 |
| 2020/0075771 | A1* | 3/2020 | Kobrinsky | H10D 84/017 |
| 2020/0091144 | A1* | 3/2020 | Guler | H10D 84/013 |
| 2020/0091348 | A1* | 3/2020 | Guha | H10D 62/121 |
| 2021/0091075 | A1* | 3/2021 | Liao | H10D 84/0151 |
| 2021/0193530 | A1* | 6/2021 | Chen | H10D 84/0135 |
| 2021/0202478 | A1* | 7/2021 | Guha | H10D 30/6757 |
| 2021/0202696 | A1* | 7/2021 | Guha | H01L 21/02532 |
| 2021/0272957 | A1* | 9/2021 | Lee | H10D 84/853 |
| 2021/0336019 | A1* | 10/2021 | Su | H10D 30/6735 |
| 2022/0199771 | A1* | 6/2022 | Chouksey | H10D 84/0186 |
| 2022/0262957 | A1* | 8/2022 | Guha | H10D 84/0142 |
| 2022/0320085 | A1* | 10/2022 | Guler | H10D 84/0147 |
| 2022/0399373 | A1* | 12/2022 | Guler | H10D 30/6735 |
| 2022/0399445 | A1* | 12/2022 | Guler | H10D 62/118 |
| 2022/0399451 | A1* | 12/2022 | Guler | H10D 62/121 |
| 2022/0416039 | A1* | 12/2022 | Lavric | H10D 84/0177 |
| 2022/0416040 | A1* | 12/2022 | Guler | H10D 62/121 |
| 2022/0416041 | A1* | 12/2022 | Hasan | H10D 30/014 |
| 2022/0416044 | A1* | 12/2022 | Kumar | H10D 30/62 |
| 2023/0053433 | A1 | 2/2023 | Serizawa | |
| 2023/0087399 | A1* | 3/2023 | Nandi | H10D 30/014 257/288 |
| 2023/0088753 | A1* | 3/2023 | Cea | H10D 62/371 257/347 |
| 2023/0093657 | A1* | 3/2023 | Haran | H10D 84/83 257/365 |
| 2023/0095007 | A1* | 3/2023 | Mehandru | H10D 62/119 257/288 |
| 2023/0100952 | A1* | 3/2023 | Tung | H10D 30/62 257/295 |
| 2023/0101725 | A1* | 3/2023 | Nandi | H10D 62/149 257/401 |
| 2023/0114214 | A1* | 4/2023 | Cea | H10D 30/43 257/288 |
| 2023/0139255 | A1* | 5/2023 | Agrawal | H10D 64/018 257/347 |
| 2023/0163215 | A1* | 5/2023 | Guler | H10D 30/6757 438/197 |
| 2023/0178542 | A1* | 6/2023 | Gossner | H10D 89/921 257/398 |
| 2023/0178622 | A1* | 6/2023 | Guler | H10D 30/6757 257/401 |
| 2023/0187356 | A1* | 6/2023 | Yemeniciouglu | H10D 62/822 257/190 |
| 2023/0187494 | A1* | 6/2023 | Yemenicioglu | H10D 30/6757 |
| 2023/0187507 | A1* | 6/2023 | Majhi | H10D 30/6729 |
| 2023/0187517 | A1* | 6/2023 | Guler | H10D 84/0151 257/178 |
| 2023/0197713 | A1* | 6/2023 | Bouche | H10D 84/038 257/401 |
| 2023/0197714 | A1* | 6/2023 | Bouche | H10D 86/215 257/401 |
| 2023/0197722 | A1* | 6/2023 | Hasan | H10D 84/0167 257/351 |
| 2023/0197779 | A1* | 6/2023 | Nabors | H01L 23/485 257/288 |
| 2023/0197785 | A1* | 6/2023 | Bomberger | H10D 30/62 257/368 |
| 2023/0197819 | A1* | 6/2023 | Bouche | H10D 84/0151 257/401 |
| 2023/0197854 | A1* | 6/2023 | Guler | H10D 62/151 257/401 |
| 2023/0207317 | A1* | 6/2023 | Bomberger | H10D 30/014 257/401 |
| 2023/0207465 | A1* | 6/2023 | Wei | H10D 30/6735 |
| 2023/0207700 | A1* | 6/2023 | Kobrinsky | H10D 30/6744 257/351 |
| 2023/0268382 | A1* | 8/2023 | Sharma | H10D 87/00 257/152 |
| 2023/0276615 | A1* | 8/2023 | Sharma | H10B 12/0383 |
| 2023/0290778 | A1* | 9/2023 | Lavric | H10D 30/43 |
| 2023/0290825 | A1* | 9/2023 | Guler | H10D 30/6757 |
| 2023/0290844 | A1* | 9/2023 | Guler | H01L 21/76897 |
| 2023/0290851 | A1* | 9/2023 | Lavric | H10D 30/43 |
| 2023/0290852 | A1* | 9/2023 | Lavric | H10D 30/014 |
| 2023/0299081 | A1* | 9/2023 | Guler | H10D 30/014 257/347 |
| 2023/0299165 | A1* | 9/2023 | Guler | H10D 30/6735 |
| 2023/0307449 | A1* | 9/2023 | Chu | H10D 30/6735 |
| 2023/0307514 | A1* | 9/2023 | D'Silva | H10D 64/254 |
| 2023/0317563 | A1* | 10/2023 | Amin | H10D 62/121 |
| 2023/0317731 | A1* | 10/2023 | Guler | H10D 30/6757 361/748 |
| 2023/0317786 | A1* | 10/2023 | Mehandru | H10D 64/01 257/288 |
| 2023/0317787 | A1* | 10/2023 | Guler | H10D 64/017 257/288 |
| 2023/0317807 | A1* | 10/2023 | Lavric | H10D 30/43 257/368 |
| 2023/0317808 | A1* | 10/2023 | Mehandru | H10D 62/151 257/401 |
| 2023/0317809 | A1* | 10/2023 | Naskar | H10D 64/251 257/288 |
| 2023/0352481 | A1* | 11/2023 | Lilak | H01L 24/29 |
| 2023/0402513 | A1* | 12/2023 | Galatage | H10D 62/121 |
| 2023/0420360 | A1* | 12/2023 | Haran | H01L 21/76897 |

(56) References Cited

U.S. PATENT DOCUMENTS

| | | | |
|---|---|---|---|
| 2023/0420368 A1* | 12/2023 | Sharma | H10D 64/01 |
| 2023/0420512 A1* | 12/2023 | Yemenicioglu | H10D 30/6735 |
| 2023/0420531 A1* | 12/2023 | Lavric | H10D 84/0181 |
| 2023/0420533 A1* | 12/2023 | Sharma | H01L 23/528 |
| 2023/0422462 A1* | 12/2023 | Sharma | H10D 62/121 |
| 2023/0422463 A1* | 12/2023 | Sharma | G11C 5/063 |
| 2023/0422485 A1* | 12/2023 | Sharma | H10D 30/501 |
| 2024/0006413 A1* | 1/2024 | Sharma | H10D 88/01 |
| 2024/0006416 A1* | 1/2024 | Sharma | H10D 30/6713 |
| 2024/0006484 A1* | 1/2024 | Penumatcha | H10D 62/151 |
| 2024/0006541 A1* | 1/2024 | Guha | H10D 30/014 |
| 2024/0063210 A1* | 2/2024 | Arkali Radhakrishna | H10D 84/83 |
| 2024/0071870 A1* | 2/2024 | Kuttappa | H01L 23/5227 |
| 2024/0072145 A1* | 2/2024 | Beck | H10D 30/014 |
| 2024/0088142 A1* | 3/2024 | Guler | H10D 84/0128 |
| 2024/0096881 A1* | 3/2024 | Guler | H10D 64/017 |
| 2024/0105716 A1* | 3/2024 | Guler | H10D 30/43 |
| 2024/0105770 A1* | 3/2024 | Chu | H10D 84/038 |
| 2024/0105802 A1* | 3/2024 | Guler | H10D 30/43 |
| 2024/0105803 A1* | 3/2024 | Guler | H10D 30/6757 |
| 2024/0105804 A1* | 3/2024 | Guler | H10D 30/6735 |
| 2024/0113111 A1* | 4/2024 | Guler | H10D 30/6735 |
| 2024/0145568 A1* | 5/2024 | Guler | H10D 30/014 |
| 2024/0154037 A1* | 5/2024 | Guler | H10D 84/013 |
| 2024/0164080 A1* | 5/2024 | Zheng | H10D 84/8311 |
| 2024/0170484 A1* | 5/2024 | Keech | H10D 84/0149 |
| 2024/0178101 A1* | 5/2024 | Chu | H10D 62/121 |
| 2024/0178227 A1* | 5/2024 | Addepalli | H10D 64/518 |
| 2024/0186398 A1* | 6/2024 | Lilak | H10D 62/151 |
| 2024/0213250 A1* | 6/2024 | Koh | H10D 84/853 |
| 2024/0222271 A1* | 7/2024 | Sharma | H10D 30/43 |
| 2024/0312986 A1* | 9/2024 | Lavric | H10D 84/038 |
| 2024/0312991 A1* | 9/2024 | Lavric | H10D 88/00 |
| 2024/0312996 A1* | 9/2024 | Lavric | H10D 30/6735 |
| 2024/0313096 A1* | 9/2024 | Mannebach | H10D 64/01 |
| 2024/0332077 A1* | 10/2024 | Mills | H01L 21/76898 |
| 2024/0332172 A1* | 10/2024 | Mannebach | H01L 23/528 |
| 2024/0332302 A1* | 10/2024 | D'Silva | H10D 62/121 |
| 2024/0332377 A1* | 10/2024 | Mills | H10D 64/62 |
| 2024/0332394 A1* | 10/2024 | Goldstein | H10D 62/121 |
| 2024/0347618 A1* | 10/2024 | Radlinger | H10D 84/038 |
| 2024/0395815 A1* | 11/2024 | Guler | H10D 84/038 |
| 2024/0405085 A1* | 12/2024 | Mannebach | H10D 62/121 |
| 2024/0421153 A1* | 12/2024 | D'Silva | H10D 64/251 |
| 2024/0429125 A1* | 12/2024 | Guler | H10D 84/85 |
| 2024/0429291 A1* | 12/2024 | D'Silva | H10D 30/501 |
| 2024/0429294 A1* | 12/2024 | Mills | H10D 30/6735 |
| 2025/0006568 A1* | 1/2025 | Mannebach | H01L 24/29 |
| 2025/0006740 A1* | 1/2025 | Guler | H10D 84/83 |
| 2025/0006787 A1* | 1/2025 | Guler | H10D 30/6735 |
| 2025/0022939 A1* | 1/2025 | Yeoh | H10D 30/6211 |
| 2025/0029892 A1* | 1/2025 | Puls | H10D 84/0158 |
| 2025/0081597 A1* | 3/2025 | Guler | H10D 84/0153 |
| 2025/0089312 A1* | 3/2025 | Ramaswamy | H10D 84/0167 |
| 2025/0095693 A1* | 3/2025 | Sharma | G11C 11/4091 |
| 2025/0098230 A1* | 3/2025 | Lavric | H10D 84/83135 |
| 2025/0098260 A1* | 3/2025 | Xu | H10D 62/116 |
| 2025/0107061 A1* | 3/2025 | Morrow | H10D 84/038 |
| 2025/0107108 A1* | 3/2025 | Sharma | H10B 12/50 |
| 2025/0107175 A1* | 3/2025 | Chu | H10D 84/853 |
| 2025/0107183 A1* | 3/2025 | Guler | H10D 30/6735 |
| 2025/0107228 A1* | 3/2025 | Thomas | H10D 30/6735 |
| 2025/0112120 A1* | 4/2025 | Chu | H10D 30/014 |
| 2025/0112150 A1* | 4/2025 | Jun | H10D 30/43 |
| 2025/0113529 A1* | 4/2025 | Guler | H10D 84/0158 |
| 2025/0113547 A1* | 4/2025 | Lin | H10D 30/031 |
| 2025/0113550 A1* | 4/2025 | Glass | H10D 62/121 |
| 2025/0113561 A1* | 4/2025 | Ramaswamy | H10D 84/851 |
| 2025/0113563 A1* | 4/2025 | Guler | H10D 30/6219 |
| 2025/0113595 A1* | 4/2025 | Chu | H10D 84/0188 |
| 2025/0113603 A1* | 4/2025 | Qayyum | H10D 30/43 |
| 2025/0120143 A1* | 4/2025 | Rangan | H10D 30/43 |
| 2025/0120152 A1* | 4/2025 | Guler | H10D 64/017 |

FOREIGN PATENT DOCUMENTS

| | | | | |
|---|---|---|---|---|
| CN | 117561601 A * | 2/2024 | | H10D 30/6757 |
| EP | 3627541 A1 * | 3/2020 | | H10D 84/0158 |
| WO | WO-2018182617 A1 * | 10/2018 | | H01L 21/762 |
| WO | WO-2021229740 | 11/2021 | | |
| WO | WO-2023113913 A1 * | 6/2023 | | H10D 84/0151 |
| WO | WO-2023121790 A1 * | 6/2023 | | H10D 30/6757 |

OTHER PUBLICATIONS

International Preliminary Report on Patentability for International Patent Application No. PCT/US2022/049985, mailed Jul. 5, 2024, 6 pgs.

Extended European Search Report for European Patent Application No. 22912230.4 mailed Nov. 17, 2025, 12 pgs.

* cited by examiner

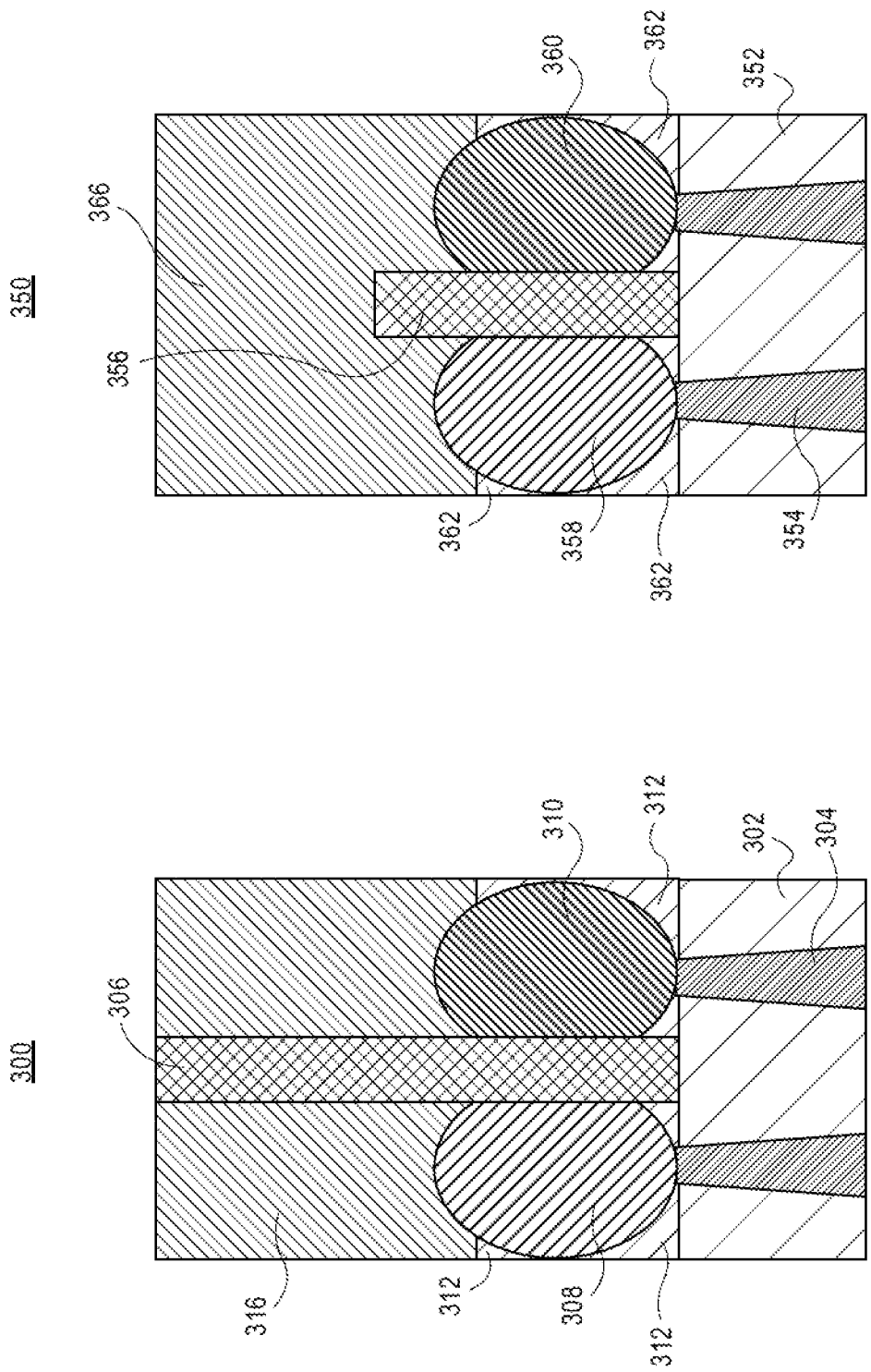

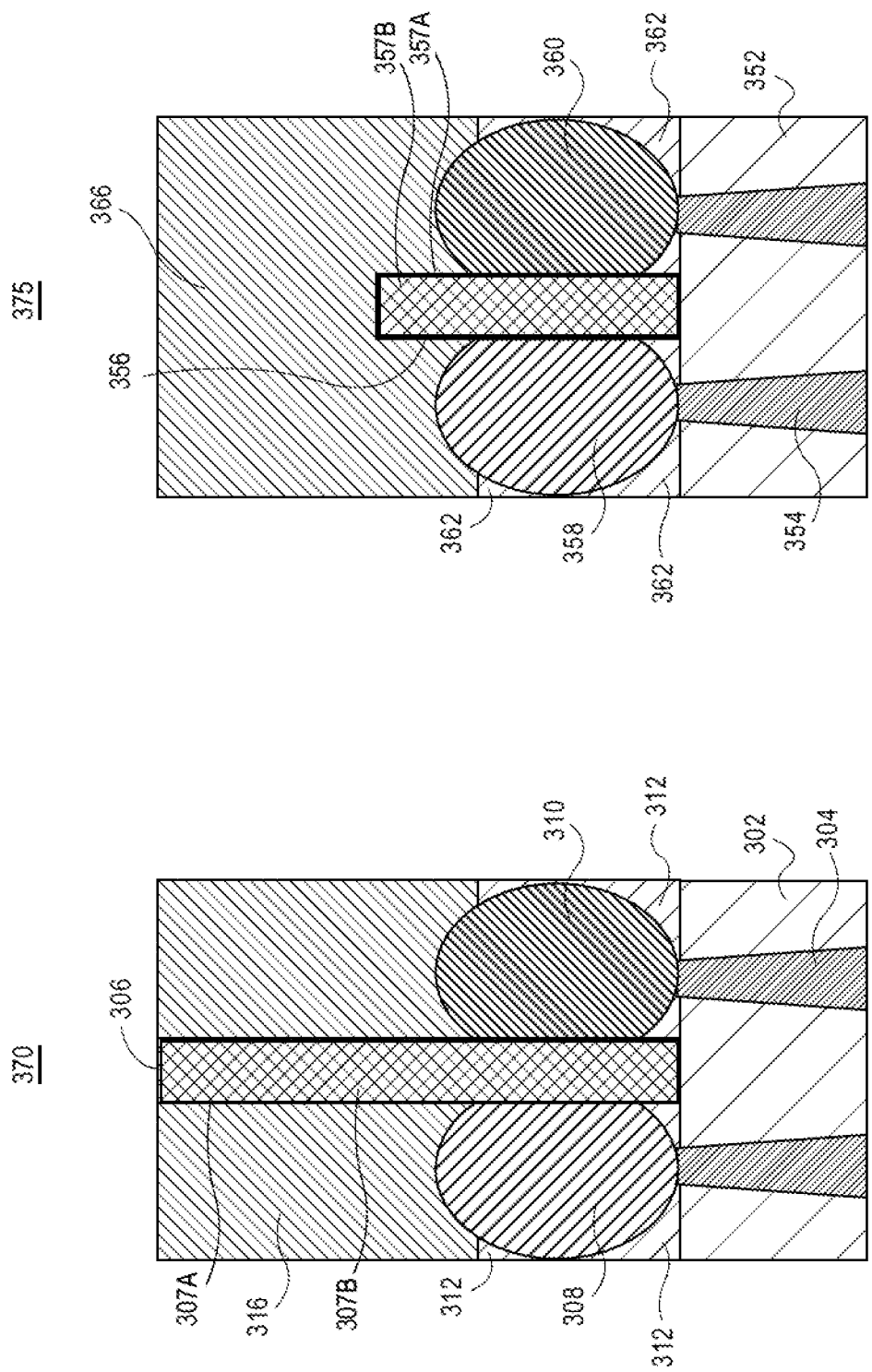

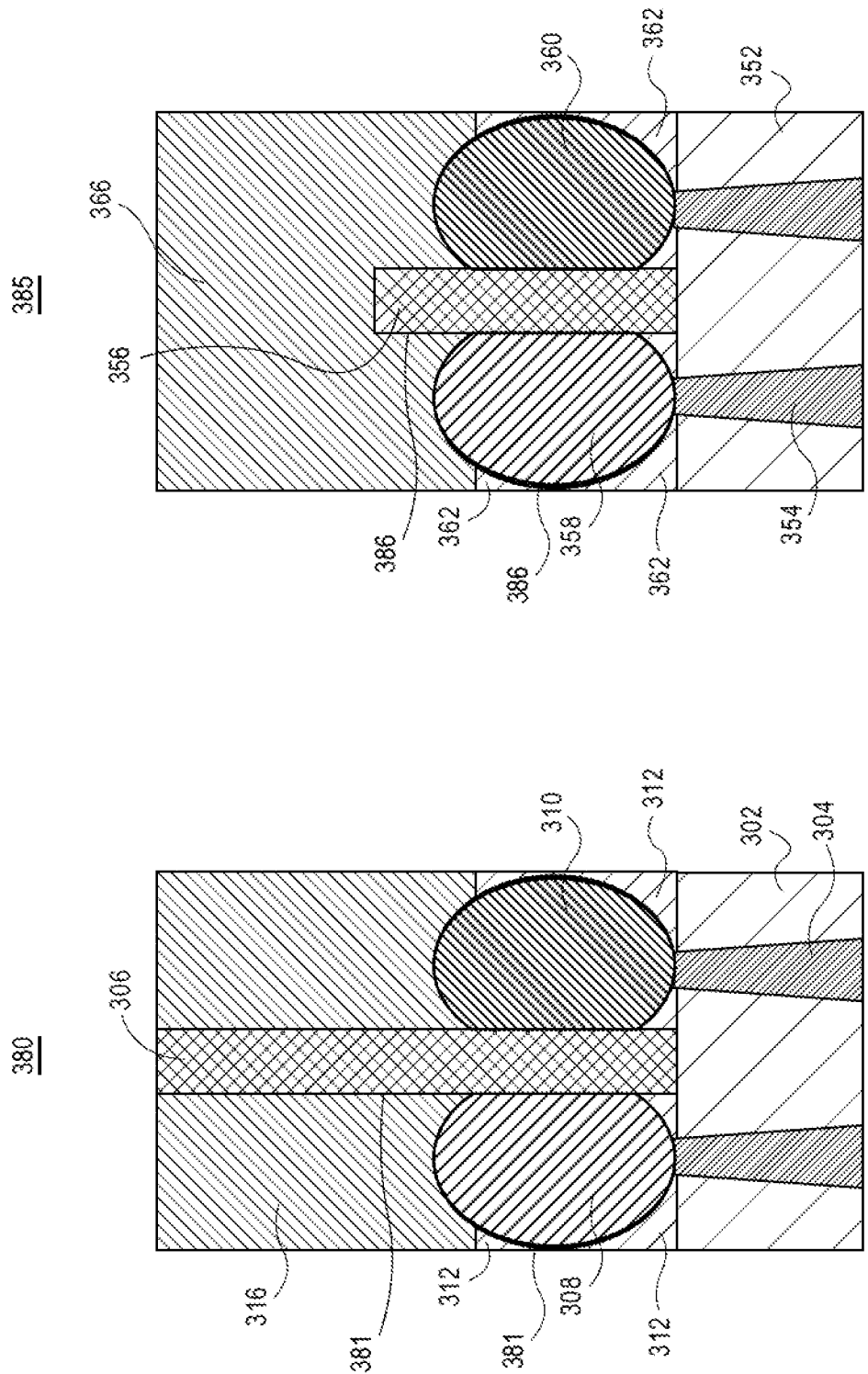

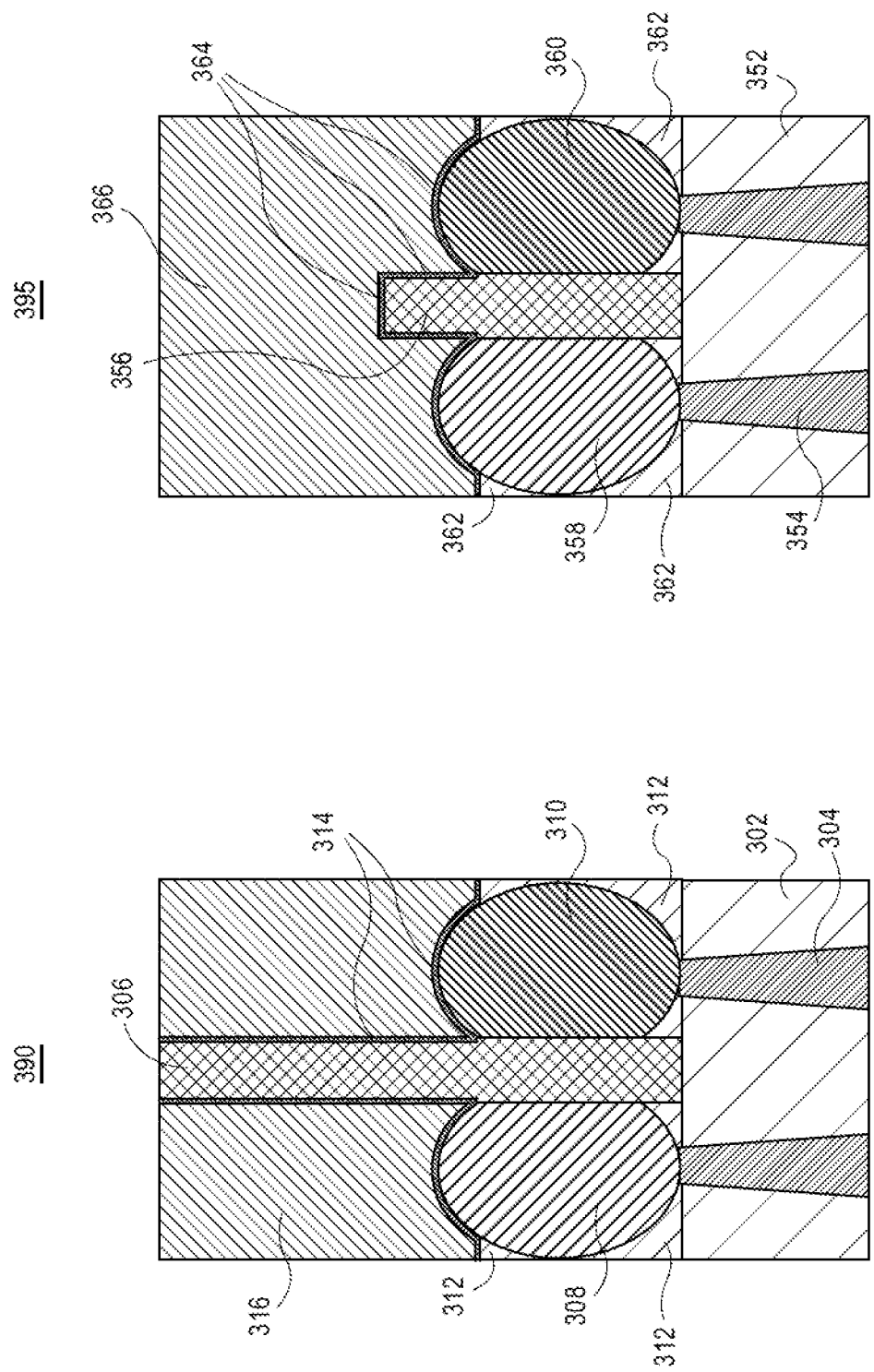

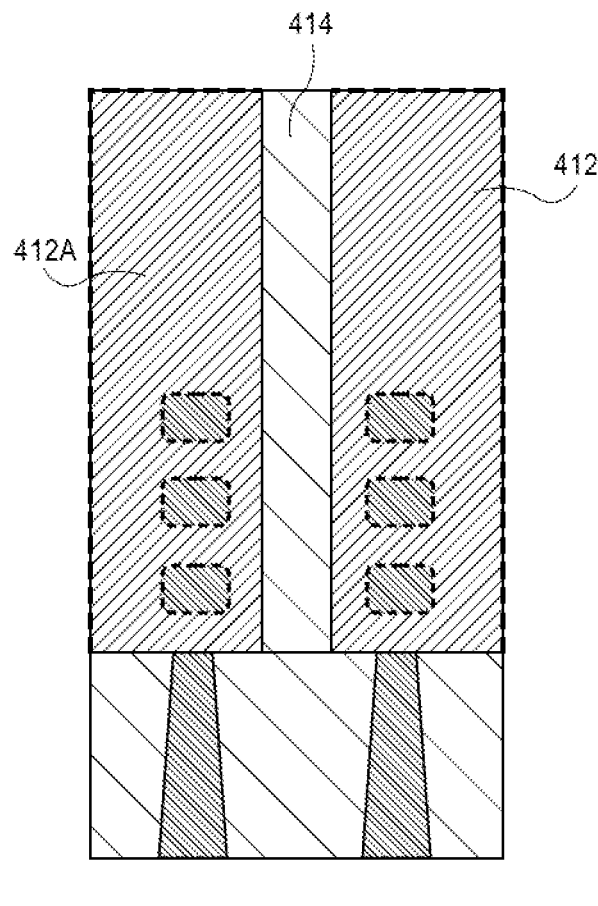
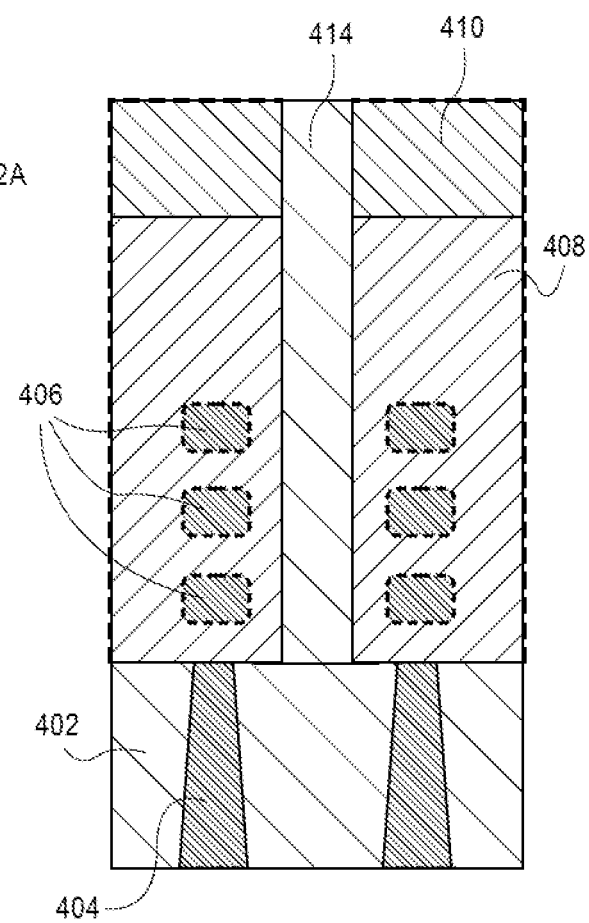
FIG. 4C  FIG. 4D

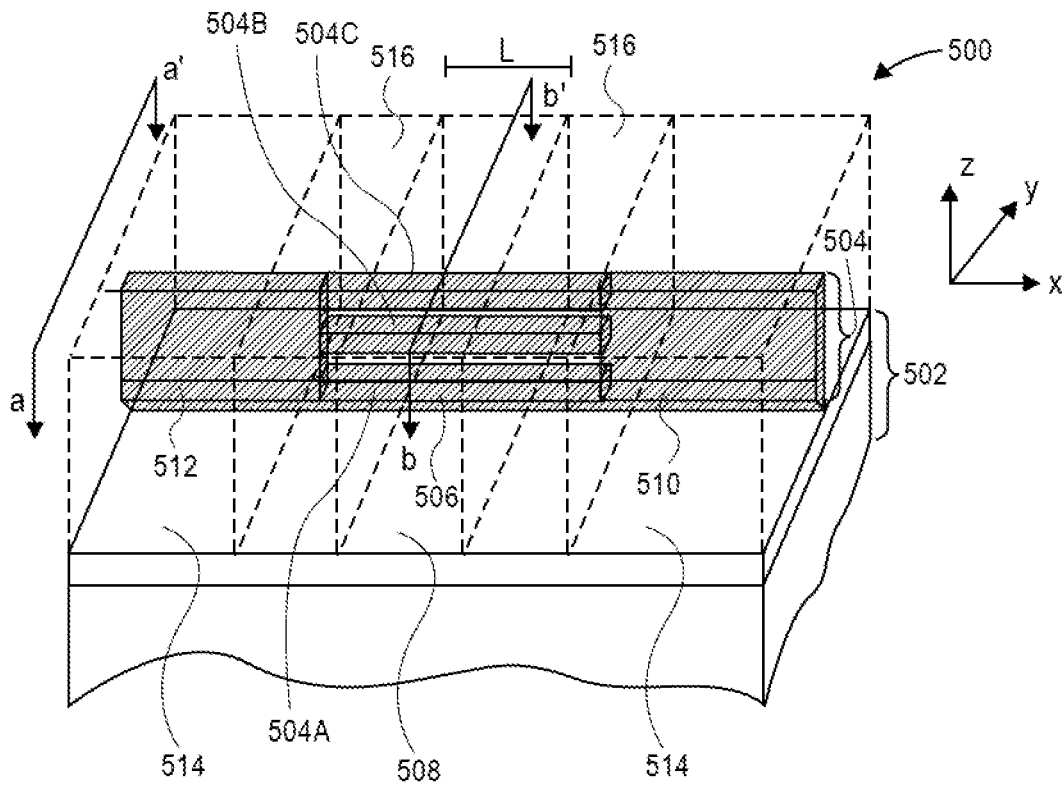
FIG. 5A
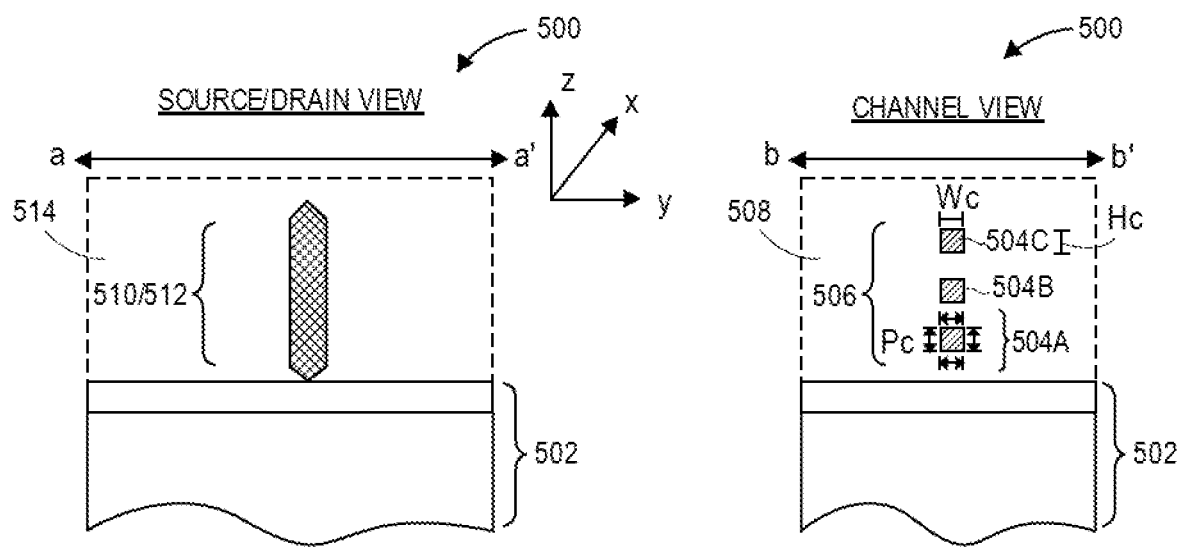
FIG. 5B
FIG. 5C

GATE-ALL-AROUND INTEGRATED CIRCUIT STRUCTURES HAVING EPITAXIAL SOURCE OR DRAIN REGION LATERAL ISOLATION

TECHNICAL FIELD

Embodiments of the disclosure are in the field of integrated circuit structures and processing and, in particular, gate-all-around integrated circuit structures having epitaxial source or drain region lateral isolation, and methods of fabricating gate-all-around integrated circuit structures having epitaxial source or drain region lateral isolation.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 3A illustrates a cross-sectional view of an integrated circuit structure having epitaxial source or drain region lateral isolation, in accordance with an embodiment of the present disclosure.

FIG. 3B illustrates a cross-sectional view of another integrated circuit structure having epitaxial source or drain region lateral isolation, in accordance with another embodiment of the present disclosure.

FIG. 3C illustrates a cross-sectional view of an integrated circuit structure having epitaxial source or drain region lateral isolation, in accordance with an embodiment of the present disclosure.

FIG. 3D illustrates a cross-sectional view of another integrated circuit structure having epitaxial source or drain region lateral isolation, in accordance with another embodiment of the present disclosure.

FIG. 3E illustrates a cross-sectional view of an integrated circuit structure having epitaxial source or drain region lateral isolation, in accordance with an embodiment of the present disclosure.

FIG. 3F illustrates a cross-sectional view of another integrated circuit structure having epitaxial source or drain region lateral isolation, in accordance with another embodiment of the present disclosure.

FIG. 3G illustrates a cross-sectional view of an integrated circuit structure having epitaxial source or drain region lateral isolation, in accordance with an embodiment of the present disclosure.

FIG. 3H illustrates a cross-sectional view of another integrated circuit structure having epitaxial source or drain region lateral isolation, in accordance with another embodiment of the present disclosure.

FIGS. 4A-4E illustrate cross-sectional views representing various operations in a method of fabricating a gate-all-around integrated circuit structure having epitaxial source or drain region lateral isolation, in accordance with an embodiment of the present disclosure.

FIG. 5A illustrates a three-dimensional cross-sectional view of a nanowire-based integrated circuit structure, in accordance with an embodiment of the present disclosure.

FIG. 5B illustrates a cross-sectional source or drain view of the nanowire-based integrated circuit structure of FIG. 5A, as taken along the a-a' axis, in accordance with an embodiment of the present disclosure.

FIG. 5C illustrates a cross-sectional channel view of the nanowire-based integrated circuit structure of FIG. 5A, as taken along the b-b' axis, in accordance with an embodiment of the present disclosure.

DESCRIPTION OF THE EMBODIMENTS

Figure 1:
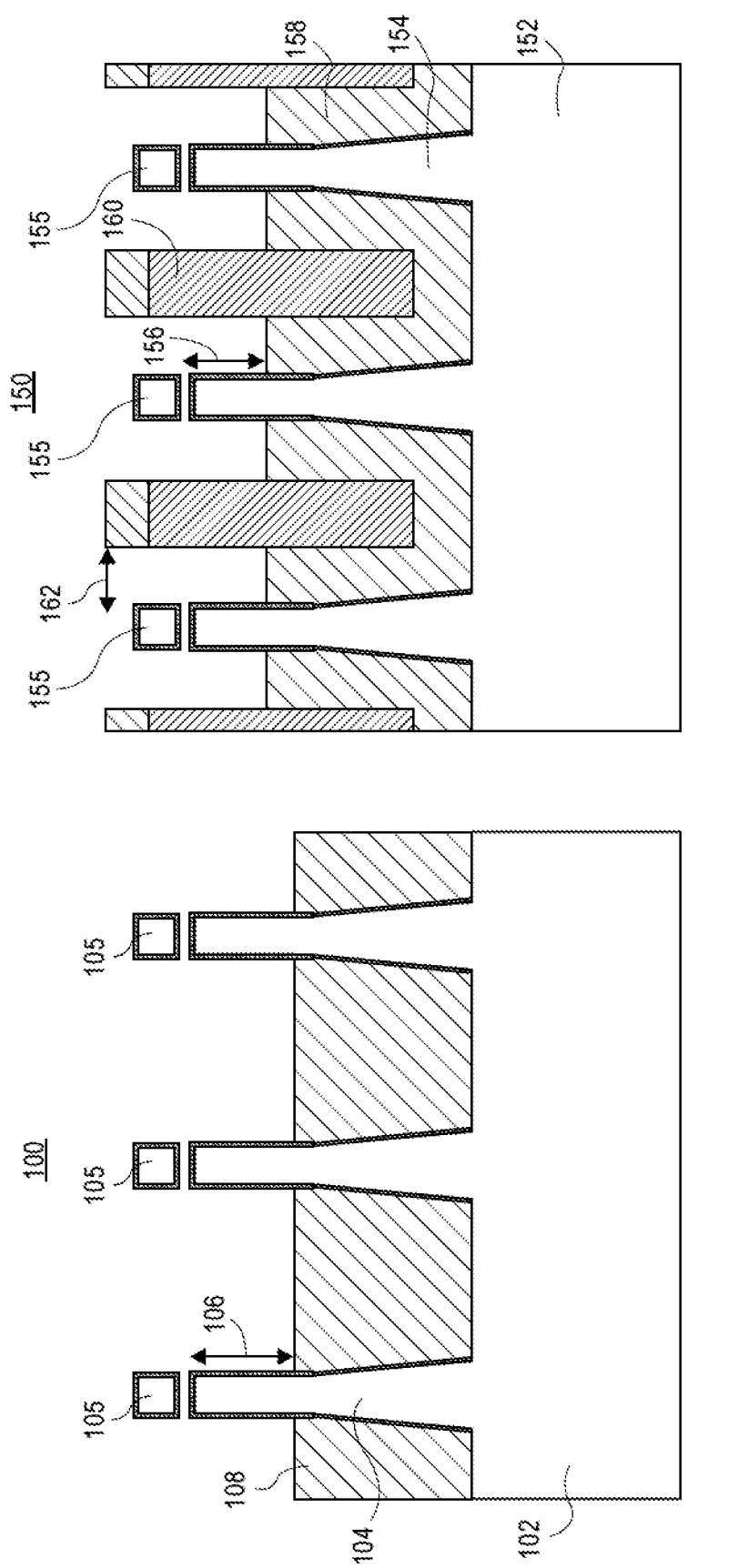
FIG. 1 illustrates cross-sectional views taken through nanowires and fins for a non-endcap architecture (left-hand side) versus a self-aligned gate endcap (SAGE) architecture (right-hand side), in accordance with an embodiment of the present disclosure.

Gate-all-around integrated circuit structures having epitaxial source or drain region lateral isolation, and methods of fabricating gate-all-around integrated circuit structures having epitaxial source or drain region lateral isolation, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to lateral isolation of epitaxial source drain for standard cell scaling. One or more embodiments described herein are directed to architectures and methods for fabricating integrated circuit structures having confined epitaxial source or drain structures. Embodiments include gate-all-around (GAA) integrated circuit or FinFET transistor architectures. One or more embodiments are directed to neighboring semiconductor structures or devices having that are otherwise not separated by self-aligned gate endcap (SAGE) structures (e.g., on a die not including SAGE, or in a portion of a die not including SAGE formation). Embodiments can include lateral confinement of source drain epitaxial growth in non-planar transistor for cell height scaling. It is to be appreciated that, unless indicated otherwise, reference to nanowires herein can indicate nanowires or nanoribbons.

To provide context, standard cell height scaling demands a robust process to avoid electrical shorts between adjacent transistors through source/drain epi. Conventionally, the size and shape of the source/drain epi is kept under control to avoid lateral shorts between transistors. It is relatively challenging to control epi wingspan (lateral width parallel to gate) in gate-all-around transistors without the help of any additional confinement scheme. As a result, the standard cell size cannot be minimized below a certain limit.

In accordance with one or more embodiments of the present disclosure, a physical barrier is formed between adjacent transistors to prevent any epi-epi shorts during epi growth. In one embodiment, the barrier is composed of low-k dielectrics to keep the capacitance low. Embodiments can be applied to FinFET or GAA transistors. In one embodiment, a fin-cut-in-contact TEM of a SRAM cell can confirm the presence of a dielectric barrier between two epi structures. In one embodiment, the dielectric liner deposited after epi formation will also wrap the dielectric barrier indicating that the epitaxial barrier was formed before epi growth.

To provide further context, particular embodiments may be directed to integration of multiple width (multi-Wsi) nanowires and nanoribbons in a non-SAGE architecture, or in neighboring regions of a SAGE architecture that are not immediately separated by a SAGE wall. In an embodiment, nanowires/nanoribbons are integrated with multiple Wsi in a non-SAGE architecture or non-SAGE portion of a front end process flow. Such a process flow may involve integration of nanowires and nanoribbons of different Wsi to provide robust functionality of next generation transistors with low power and high performance.

To provide context, balancing non-uniform epitaxial growth across integrated circuit structures can be challenging. Embodiments described herein may address unwanted merged epitaxial growth associated with growing source or drain structures on silicon (Si) regions having differential nanoribbon/nanowire architectures. Epitaxial regions may be embedded (e.g., portions of nanowires removed and then source or drain (S/D) growth is performed), as described in greater detail below in association with FIGS. 5A-5C, or formed by vertical merging (e.g., epitaxial regions are formed around existing wires), as described in greater detail below in association with FIGS. 6A-6E.

To provide further context, advantages of a self-aligned gate endcap (SAGE) architecture may include the enabling of higher layout density and, in particular, scaling of diffusion to diffusion spacing. However, certain application may not involve the use of SAGE, or regions of a structure may not include SAGE walls, yet high density may still be sought after. In such scenarios, undesirable merging of neighboring epitaxial regions may occur in high density locations.

To provide illustrative comparison, FIG. 1 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 1, an integrated circuit structure 100 includes a substrate 102 having fins 104 protruding therefrom by an amount 106 above an isolation structure 108 laterally surrounding lower portions of the fins 104. Corresponding nanowires 105 are over the fins 104. A gate structure may be formed over the integrated circuit structure 100 to fabricate a device. However, breaks in such a gate structure may be accommodated for by increasing the spacing between fin 104/nanowire 105 pairs. Alternatively, without increased spacing, merging of epitaxially grown source or drain structures can occur, as described in greater detail below.

By contrast, referring to the right-hand side (b) of FIG. 1, an integrated circuit structure 150 includes a substrate 152 having fins 154 protruding therefrom by an amount 156 above an isolation structure 158 laterally surrounding lower portions of the fins 104. Corresponding nanowires 155 are over the fins 154. Isolating SAGE walls 160 (which may include a hardmask thereon, as depicted) are included within the isolation structure 158 and between adjacent fin 154/nanowire 155 pairs. The distance between an isolating SAGE wall 160 and a nearest fin 154/nanowire 155 pair defines the gate endcap spacing 162. A gate structure may be formed over the integrated circuit structure 150, between insolating SAGE walls to fabricate a device. Breaks in such a gate structure are imposed by the isolating SAGE walls. Since the isolating SAGE walls 160 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 160. In an embodiment, as depicted, the SAGE walls 160 each include a lower dielectric portion and a dielectric cap on the lower dielectric portion.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls. Other embodiments, however, involve applications, or regions of a die or architecture that include neighboring structures that are not separated by isolation gate walls or self-aligned gate endcap (SAGE) walls.

Figure 2:
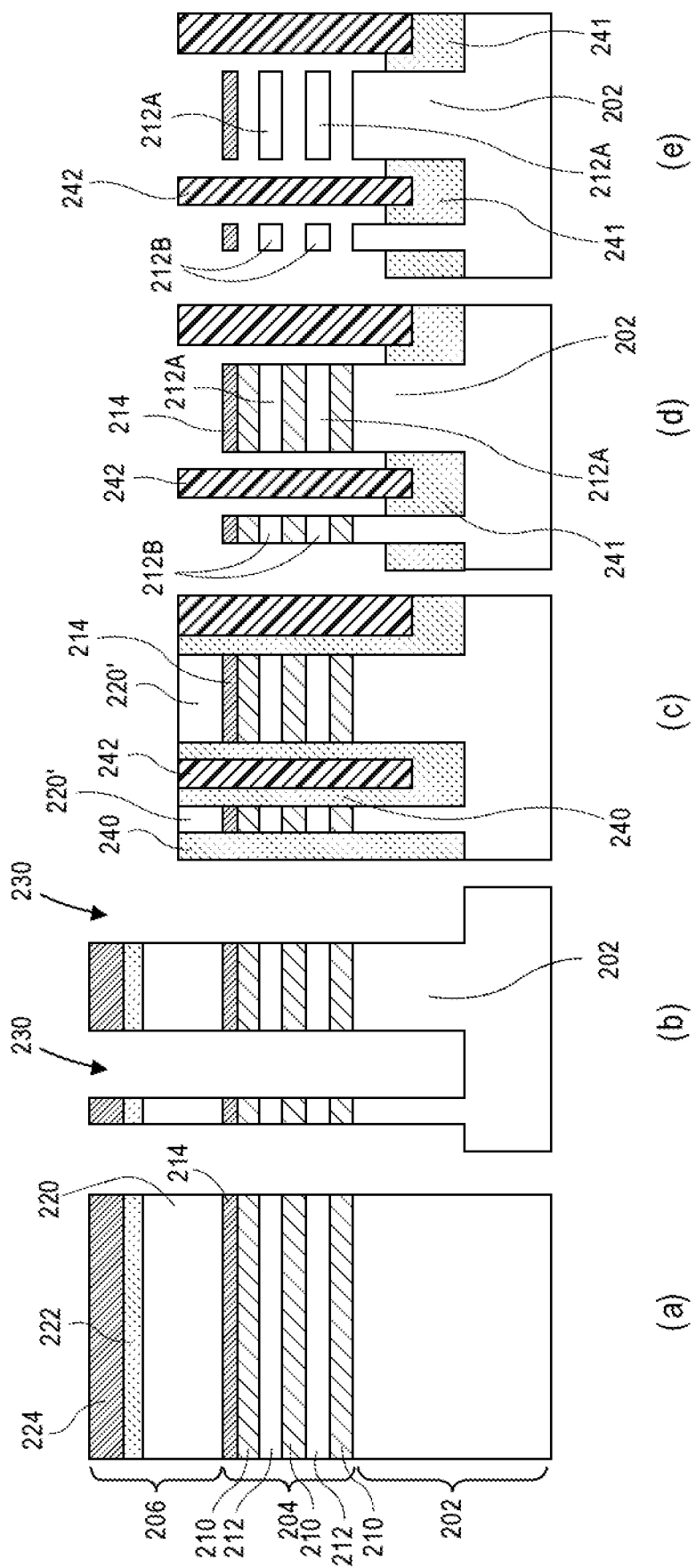
FIG. 2 illustrate cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 2 illustrate cross-sectional views representing various operations in a method of fabricating a self-aligned gate endcap (SAGE) structure with gate-all-around devices, in accordance with an embodiment of the present disclosure.

Referring to part (a) of FIG. 2, a starting structure includes a nanowire patterning stack 204 above a substrate 202. A lithographic patterning stack 206 is formed above the nanowire patterning stack 204. The nanowire patterning stack 204 includes alternating silicon germanium layers 210 and silicon layers 212. A protective mask 214 is between the nanowire patterning stack 204 and the lithographic patterning stack 206. In one embodiment, the lithographic patterning stack 206 is trilayer mask composed of a topographic masking portion 220, an anti-reflective coating (ARC) layer 222, and a photoresist layer 224. In a particular such embodiment, the topographic masking portion 220 is a carbon hardmask (CHM) layer and the anti-reflective coating layer 222 is a silicon ARC layer.

Referring to part (b) of FIG. 2, the stack of part (a) is lithographically patterned and then etched to provide an etched structure including a patterned substrate 202 and trenches 230.

Referring to part (c) of FIG. 2, the structure of part (b) has an isolation layer 240 and a SAGE material 242 formed in trenches 230. The structure is then planarized to leave patterned topographic masking layer 220' as an exposed upper layer.

Referring to part (d) of FIG. 2, the isolation layer 240 is recessed below an upper surface of the patterned substrate 202, e.g., to define a protruding fin portion and to provide a trench isolation structure 241 beneath SAGE walls 242.

Referring to part (e) of FIG. 2, the silicon germanium layers 210 are removed at least in the channel region to release silicon nanowires 212A and 212B. Subsequent to the formation of the structure of part (e) of FIG. 2, a gate stacks may be formed around nanowires 212B or 212A, over protruding fins of substrate 202, and between SAGE walls 242. In one embodiment, prior to formation of the gate stacks, the remaining portion of protective mask 214 is removed. In another embodiment, the remaining portion of protective mask 214 is retained as an insulating fin hat as an artifact of the processing scheme.

Referring again to part (e) of FIG. 2, it is to be appreciated that a channel view is depicted, with source or drain regions being locating into and out of the page. In an embodiment, the channel region including nanowires 212B has a width less than the channel region including nanowires 212A. Thus, in an embodiment, an integrated circuit structure includes multiple width (multi-Wsi) nanowires. Although structures of 212B and 212A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 2).

In one aspect, a fin cut in a source or drain location can reveal an epitaxial (epi) barrier between two adjacent transistors. The height of the barrier is as tall as gate. As an example, FIG. 3A illustrates a cross-sectional view of an integrated circuit structure having epitaxial source or drain region lateral isolation, in accordance with an embodiment of the present disclosure. Alternatively, a height of the barrier is shorter than gate. As an example, FIG. 3B illustrates a cross-sectional view of another integrated circuit structure having epitaxial source or drain region lateral isolation, in accordance with another embodiment of the present disclosure. In either case, the source or drain structures described can be adjacent to a stack of nanowires, a stack of nanoribbons, or a fin.

Referring to FIG. 3A, an integrated circuit structure 300 includes a shallow trench isolation (STI) structure 302 having sub-fins 304 therein. A first epitaxial source or drain structure 308 is on a first (left) sub-fin 304. A second epitaxial source or drain structure 310 is on a second (right) sub-fin 304. In one embodiment, the first 308 and second 310 epitaxial source or drain structures are of opposite conductivity type (e.g., N-type versus P-type), as is depicted by the differential shading. In another embodiment, the first 308 and second 310 epitaxial source or drain structures are of a same conductivity type (e.g., N-type or P-type). The first 308 and second 310 epitaxial source or drain structures are physically separated from one another by a dielectric barrier or intervening dielectric structure 306. The first 308 and second 310 epitaxial source or drain structures are included in a dielectric layer 312. A source or drain contact structure 316 is on the first 308 and second 310 epitaxial source or drain structures. In one embodiment, a portion of the source or drain contact structure 316 on the first epitaxial source or drain structure 308 is physically separated from a portion of the source or drain contact structure 316 on the second epitaxial source or drain structure 310 by the intervening dielectric structure 306, as is depicted. In one such embodiment, the intervening dielectric structure 306 has a top surface co-planar with a top surface of an adjacent gate structure (e.g., a gate structure into the page).

Referring to FIG. 3B, an integrated circuit structure 350 includes a shallow trench isolation (STI) structure 352 having sub-fins 354 therein. A first epitaxial source or drain structure 358 is on a first (left) sub-fin 354. A second epitaxial source or drain structure 360 is on a second (right) sub-fin 354. In one embodiment, the first 358 and second 360 epitaxial source or drain structures are of opposite conductivity type (e.g., N-type versus P-type), as is depicted by the differential shading. In another embodiment, the first 358 and second 360 epitaxial source or drain structures are of a same conductivity type (e.g., N-type versus P-type). The first 358 and second 360 epitaxial source or drain structures are physically separated from one another by a dielectric barrier or intervening dielectric structure 356. The first 358 and second 360 epitaxial source or drain structures are included in a dielectric layer 362. A source or drain contact structure 366 is on the first 358 and second 360 epitaxial source or drain structures. In one embodiment, a portion of the source or drain contact structure 366 on the first epitaxial source or drain structure 358 is continuous with a portion of the source or drain contact structure 366 on the second epitaxial source or drain structure 360, as is depicted. In one such embodiment, the intervening dielectric structure 356 has a top surface below a top surface of an adjacent gate structure (e.g., a gate structure into the page).

As another example, FIG. 3C illustrates a cross-sectional view of an integrated circuit structure having epitaxial source or drain region lateral isolation, in accordance with an embodiment of the present disclosure. Alternatively, a height of the barrier is shorter than gate. As an example, FIG. 3D illustrates a cross-sectional view of another integrated circuit structure having epitaxial source or drain region lateral isolation, in accordance with another embodiment of the present disclosure. In either case, the source or drain structures described can be adjacent to a stack of nanowires, a stack of nanoribbons, or a fin.

Referring to FIG. 3C, an integrated circuit structure 370 includes a shallow trench isolation (STI) structure 302 having sub-fins 304 therein. A first epitaxial source or drain structure 308 is on a first (left) sub-fin 304. A second epitaxial source or drain structure 310 is on a second (right) sub-fin 304. In one embodiment, the first 308 and second 310 epitaxial source or drain structures are of opposite conductivity type (e.g., N-type versus P-type), as is depicted by the differential shading. In another embodiment, the first 308 and second 310 epitaxial source or drain structures are of a same conductivity type (e.g., N-type or P-type). The first 308 and second 310 epitaxial source or drain structures are physically separated from one another by a dielectric barrier or intervening dielectric structure 306. In one embodiment, the dielectric barrier or intervening dielectric structure 306 includes a dielectric liner 307A and a dielectric fill 307B, as is depicted. The first 308 and second 310 epitaxial source or drain structures are included in a dielectric layer 312. A source or drain contact structure 316 is on the first 308 and second 310 epitaxial source or drain structures. In one embodiment, a portion of the source or drain contact structure 316 on the first epitaxial source or drain structure 308 is physically separated from a portion of the source or drain contact structure 316 on the second epitaxial source or drain structure 310 by the intervening dielectric structure 306, as is depicted. In one such embodiment, the intervening dielectric structure 306 has a top surface co-planar with a top surface of an adjacent gate structure (e.g., a gate structure into the page).

Referring to FIG. 3D, an integrated circuit structure 375 includes a shallow trench isolation (STI) structure 352 having sub-fins 354 therein. A first epitaxial source or drain structure 358 is on a first (left) sub-fin 354. A second epitaxial source or drain structure 360 is on a second (right) sub-fin 354. In one embodiment, the first 358 and second 360 epitaxial source or drain structures are of opposite conductivity type (e.g., N-type versus P-type), as is depicted by the differential shading. In another embodiment, the first 358 and second 360 epitaxial source or drain structures are of a same conductivity type (e.g., N-type versus P-type). The first 358 and second 360 epitaxial source or drain structures are physically separated from one another by a dielectric barrier or intervening dielectric structure 356. In one embodiment, the dielectric barrier or intervening dielectric structure 356 includes a dielectric liner 357A and a dielectric fill 357B, as is depicted. The first 358 and second 360 epitaxial source or drain structures are included in a dielectric layer 362. A source or drain contact structure 366 is on the first 358 and second 360 epitaxial source or drain structures. In one embodiment, a portion of the source or drain contact structure 366 on the first epitaxial source or drain structure 358 is continuous with a portion of the source or drain contact structure 366 on the second epitaxial source or drain structure 360, as is depicted. In one such embodiment, the intervening dielectric structure 356 has a top surface below a top surface of an adjacent gate structure (e.g., a gate structure into the page).

As another example, FIG. 3E illustrates a cross-sectional view of an integrated circuit structure having epitaxial source or drain region lateral isolation, in accordance with an embodiment of the present disclosure. Alternatively, a height of the barrier is shorter than gate. As an example, FIG. 3F illustrates a cross-sectional view of another integrated circuit structure having epitaxial source or drain region lateral isolation, in accordance with another embodiment of the present disclosure. In either case, the source or drain structures described can be adjacent to a stack of nanowires, a stack of nanoribbons, or a fin.

Referring to FIG. 3E, an integrated circuit structure 380 includes a shallow trench isolation (STI) structure 302 having sub-fins 304 therein. A first epitaxial source or drain structure 308 is on a first (left) sub-fin 304. A second epitaxial source or drain structure 310 is on a second (right) sub-fin 304. In one embodiment, the first 308 and second 310 epitaxial source or drain structures are of opposite conductivity type (e.g., N-type versus P-type), as is depicted by the differential shading. In another embodiment, the first 308 and second 310 epitaxial source or drain structures are of a same conductivity type (e.g., N-type or P-type). The first 308 and second 310 epitaxial source or drain structures are physically separated from one another by a dielectric barrier or intervening dielectric structure 306. The first 308 and second 310 epitaxial source or drain structures are included in a dielectric layer 312. A source or drain contact structure 316 is on the first 308 and second 310 epitaxial source or drain structures. In one embodiment, a portion of the source or drain contact structure 316 on the first epitaxial source or drain structure 308 is physically separated from a portion of the source or drain contact structure 316 on the second epitaxial source or drain structure 310 by the intervening dielectric structure 306, as is depicted. In one such embodiment, the intervening dielectric structure 306 has a top surface co-planar with a top surface of an adjacent gate structure (e.g., a gate structure into the page). In an embodiment, a dielectric liner 381 is deposited following epitaxial deposition, and is removed from the region where the source or drain contact structure 316 makes direct electrical contact with the first and/or second epitaxial source or drain structures 308/310, as is depicted.

Referring to FIG. 3F, an integrated circuit structure 385 includes a shallow trench isolation (STI) structure 352 having sub-fins 354 therein. A first epitaxial source or drain structure 358 is on a first (left) sub-fin 354. A second epitaxial source or drain structure 360 is on a second (right) sub-fin 354. In one embodiment, the first 358 and second 360 epitaxial source or drain structures are of opposite conductivity type (e.g., N-type versus P-type), as is depicted by the differential shading. In another embodiment, the first 358 and second 360 epitaxial source or drain structures are of a same conductivity type (e.g., N-type versus P-type). The first 358 and second 360 epitaxial source or drain structures are physically separated from one another by a dielectric barrier or intervening dielectric structure 356. The first 358 and second 360 epitaxial source or drain structures are included in a dielectric layer 362. A source or drain contact structure 366 is on the first 358 and second 360 epitaxial source or drain structures. In one embodiment, a portion of the source or drain contact structure 366 on the first epitaxial source or drain structure 358 is continuous with a portion of the source or drain contact structure 366 on the second epitaxial source or drain structure 360, as is depicted. In one such embodiment, the intervening dielectric structure 356 has a top surface below a top surface of an adjacent gate structure (e.g., a gate structure into the page). In an embodiment, a dielectric liner 386 is deposited following epitaxial deposition, and is removed from the region where the source or drain contact structure 366 makes direct electrical contact with the first and/or second epitaxial source or drain structures 358/360, as is depicted.

As another example, FIG. 3G illustrates a cross-sectional view of an integrated circuit structure having epitaxial source or drain region lateral isolation, in accordance with an embodiment of the present disclosure. Alternatively, a height of the barrier is shorter than gate. As an example, FIG. 3H illustrates a cross-sectional view of another integrated circuit structure having epitaxial source or drain region lateral isolation, in accordance with another embodiment of the present disclosure. In either case, the source or drain structures described can be adjacent to a stack of nanowires, a stack of nanoribbons, or a fin.

Referring to FIG. 3G, an integrated circuit structure 390 includes a shallow trench isolation (STI) structure 302 having sub-fins 304 therein. A first epitaxial source or drain structure 308 is on a first (left) sub-fin 304. A second epitaxial source or drain structure 310 is on a second (right) sub-fin 304. In one embodiment, the first 308 and second 310 epitaxial source or drain structures are of opposite conductivity type (e.g., N-type versus P-type), as is depicted by the differential shading. In another embodiment, the first 308 and second 310 epitaxial source or drain structures are of a same conductivity type (e.g., N-type or P-type). The first 308 and second 310 epitaxial source or drain structures are physically separated from one another by a dielectric barrier or intervening dielectric structure 306. The first 308 and second 310 epitaxial source or drain structures are included in a dielectric layer 312. A source or drain contact structure, e.g., including a conductive barrier layer 314 and a conductive fill 316, is on the first 308 and second 310 epitaxial source or drain structures. In one embodiment, a portion of the source or drain contact structure 314/316 on the first epitaxial source or drain structure 308 is physically separated from a portion of the source or drain contact structure 314/316 on the second epitaxial source or drain structure 310 by the intervening dielectric structure 306, as is depicted. In one such embodiment, the intervening dielectric structure 306 has a top surface co-planar with a top surface of an adjacent gate structure (e.g., a gate structure into the page).

Referring to FIG. 3H, an integrated circuit structure 395 includes a shallow trench isolation (STI) structure 352 having sub-fins 354 therein. A first epitaxial source or drain structure 358 is on a first (left) sub-fin 354. A second epitaxial source or drain structure 360 is on a second (right) sub-fin 354. In one embodiment, the first 358 and second 360 epitaxial source or drain structures are of opposite conductivity type (e.g., N-type versus P-type), as is depicted by the differential shading. In another embodiment, the first 358 and second 360 epitaxial source or drain structures are of a same conductivity type (e.g., N-type versus P-type). The first 358 and second 360 epitaxial source or drain structures are physically separated from one another by a dielectric barrier or intervening dielectric structure 356. The first 358 and second 360 epitaxial source or drain structures are included in a dielectric layer 362. A source or drain contact structure, e.g., including a conductive barrier layer 364 and a conductive fill 366, is on the first 358 and second 360 epitaxial source or drain structures. In one embodiment, a portion of the source or drain contact structure 364/366 on the first epitaxial source or drain structure 358 is continuous with a portion of the source or drain contact structure 364/366 on the second epitaxial source or drain structure 360, as is depicted. In one such embodiment, the intervening dielectric structure 356 has a top surface below a top surface of an adjacent gate structure (e.g., a gate structure into the page).

As described above, dielectric barrier or intervening dielectric structure can be implemented to enhance epitaxial confinement. As an exemplary processing scheme, FIGS. 4A-4E illustrate cross-sectional views representing various operations in a method of fabricating a gate-all-around integrated circuit structure having epitaxial source or drain region lateral isolation, in accordance with an embodiment of the present disclosure. It is to be appreciated that the embodiments described and illustrated may also be applicable for a fin structure in place of a stack of nanowires (or nanoribbons).

Figure 4A:
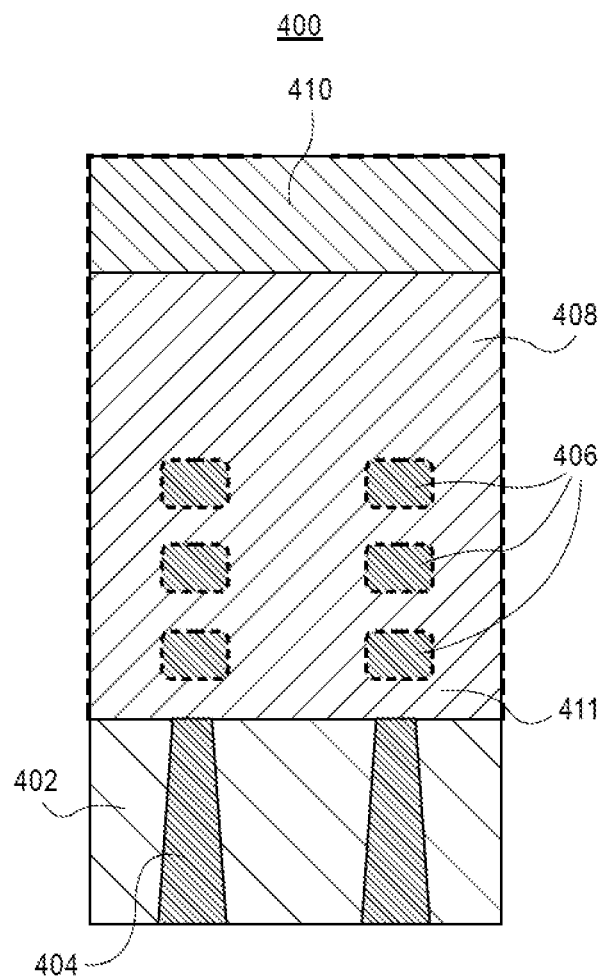

Referring to FIG. 4A, a starting structure 400 includes sub-fins 404, such as silicon sub-fins, protruding through isolation structures 402, such as silicon oxide or silicon oxide isolation structures. Stacks of nanowires 406, such as silicon nanowires, are formed over corresponding ones of the sub-fins 404. A gate structure is over the stacks of nanowires 406, with the gate stack being into the page of FIG. 4A as indicated by the dashed lines. The gate structure can include a dummy gate electrode 408, a dummy gate dielectric (not depicted), and an optional dielectric gate cap 410. A source or drain cavity 411 is in front of the gate structure and exposes a source or drain location.

Figure 4B:
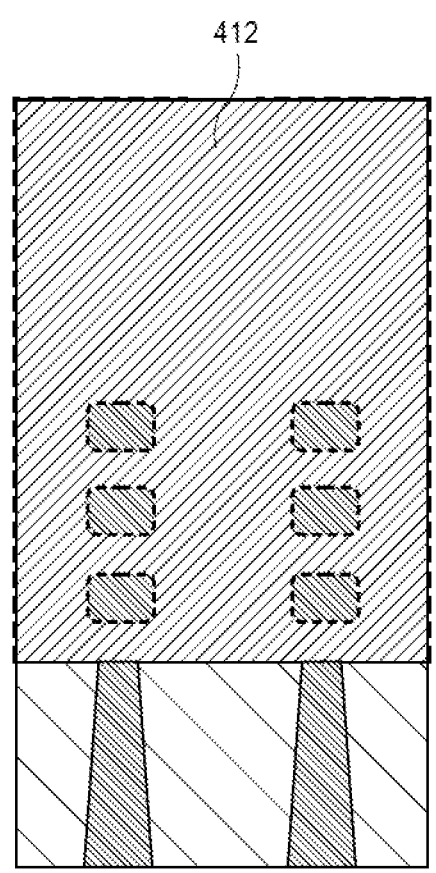

Referring to FIG. 4B, a sacrificial hardmask 412, such as a carbon-based or si-based hardmask, is formed in the source or drain cavity 411 in front of the gate structure, i.e., in the source or drain location.

Referring to FIG. 4C, an opening is formed in the sacrificial hardmask 412 to form patterned sacrificial hardmask 412A. The opening is then filled with a dielectric material, e.g., by deposition and planarization, to form an intervening dielectric structure 414. In one embodiment, the intervening dielectric structure 414 is composed of a low-k dielectric material. In one embodiment, the intervening dielectric structure 414 is composed of a dielectric material having a dielectric constant lower (or higher, or the same as) than a dielectric constant of the STI structure 402. In another embodiment, the intervening dielectric structure 414 is composed of a dielectric material similar to or the same as the STI structure 402.

Referring to FIG. 4D, the patterned sacrificial hardmask 412A is removed to leave the intervening dielectric structure 414 remaining in the source or drain cavity 411 in front of the gate structure, i.e., in the source or drain location.

Figure 4E:
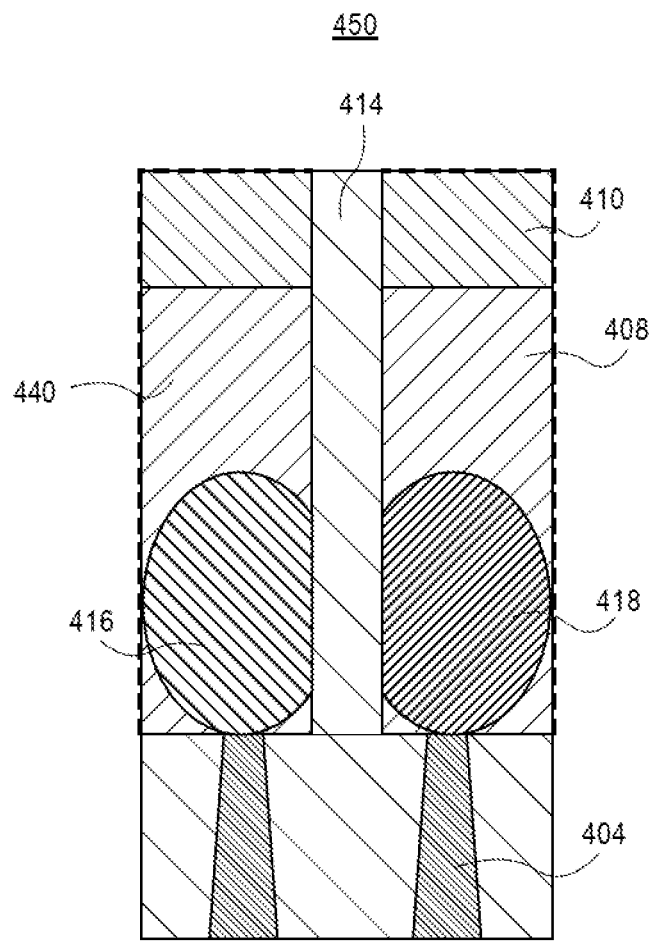

Referring to FIG. 4E, epitaxial source or drain structures 416 and 418 are grown in front of the gate structure, i.e., in the source or drain location. In one embodiment, the first 416 and second 418 epitaxial source or drain structures are of opposite conductivity type (e.g., N-type versus P-type), as is depicted by the differential shading. In another embodiment, the first 416 and second 418 epitaxial source or drain structures are of a same conductivity type (e.g., N-type versus P-type). The first 416 and second 418 epitaxial source or drain structures are physically separated from one another by the intervening dielectric structure 414. Subsequent processing may include forming a dielectric layer around lower portions of the first 416 and second 418 epitaxial source or drain structures. A source or drain contact structure, e.g., including a conductive barrier layer and a conductive fill, can be formed on the first 416 and second 418 epitaxial source or drain structures, e.g., at location 440, such as described in association with FIGS. 3A-3H.

With reference again to FIG. 4A-4E, in accordance with an embodiment of the present disclosure, an integrated circuit structure 450 includes a first vertical arrangement of nanowires (left 406) and a second vertical arrangement of nanowires (right 406). A gate stack 408/410 (cap 410 being optional) is over the first and second vertical arrangements of nanowires 406. First epitaxial source or drain structures 416 are at ends of the first vertical arrangement of nanowires (front end structure shown, with back end structure to be understood as being into the page, behind the gate structure). Second epitaxial source or drain structures 418 are at ends of the second vertical arrangement of nanowires (front end structure shown, with back end structure to be understood as being into the page, behind the gate structure). An intervening dielectric structure 414 is between neighboring ones of the first epitaxial source or drain structures 416 and the second epitaxial source or drain structures 418. In one embodiment, the intervening dielectric structure 414 has a top surface co-planar with a top surface of the gate structure 408/410, as is depicted.

In an embodiment, the intervening dielectric structure 414 is on a top surface of a shallow trench isolation (STI) structure 402. In one such embodiment, the intervening dielectric structure 414 includes a dielectric material having a lower dielectric constant than the STI structure 402.

In an embodiment, the first epitaxial source or drain structures 416 and the second epitaxial source or drain structures 418 are each non-discrete epitaxial source or drain structures, examples of which are described below. In an embodiment, the first vertical arrangement of nanowires (left 406) is over a first sub-fin (left 404), and the second vertical arrangement of nanowires (right 406) is over a second sub-fin (right 404), as is depicted.

To highlight an exemplary integrated circuit structure having three vertically arranged nanowires, FIG. 5A illustrates a three-dimensional cross-sectional view of a nanowire-based integrated circuit structure, in accordance with an embodiment of the present disclosure. FIG. 5B illustrates a cross-sectional source or drain view of the nanowire-based integrated circuit structure of FIG. 5A, as taken along the a-a' axis. FIG. 5C illustrates a cross-sectional channel view of the nanowire-based integrated circuit structure of FIG. 5A, as taken along the b-b' axis.

Referring to FIG. 5A, an integrated circuit structure 500 includes one or more vertically stacked nanowires (504 set) above a substrate 502. An optional fin between the bottommost nanowire and the substrate 502 is not depicted for the sake of emphasizing the nanowire portion for illustrative purposes. Embodiments herein are targeted at both single wire devices and multiple wire devices. As an example, a three nanowire-based devices having nanowires 504A, 504B and 504C is shown for illustrative purposes. For convenience of description, nanowire 504A is used as an example where description is focused on one of the nanowires. It is to be appreciated that where attributes of one nanowire are described, embodiments based on a plurality of nanowires may have the same or essentially the same attributes for each of the nanowires.

Each of the nanowires 504 includes a channel region 506 in the nanowire. The channel region 506 has a length (L). Referring to FIG. 5C, the channel region also has a perimeter (Pc) orthogonal to the length (L). Referring to both FIGS. 5A and 5C, a gate electrode stack 508 surrounds the entire perimeter (Pc) of each of the channel regions 506. The gate electrode stack 508 includes a gate electrode along with a gate dielectric layer between the channel region 506 and the gate electrode (not shown). In an embodiment, the channel region is discrete in that it is completely surrounded by the gate electrode stack 508 without any intervening material such as underlying substrate material or overlying channel fabrication materials. Accordingly, in embodiments having a plurality of nanowires 504, the channel regions 506 of the nanowires are also discrete relative to one another.

Referring to both FIGS. 5A and 5B, integrated circuit structure 500 includes a pair of non-discrete source or drain regions 510/512. The pair of non-discrete source or drain regions 510/512 is on either side of the channel regions 506 of the plurality of vertically stacked nanowires 504. Furthermore, the pair of non-discrete source or drain regions 510/512 is adjoining for the channel regions 506 of the plurality of vertically stacked nanowires 504. In one such embodiment, not depicted, the pair of non-discrete source or drain regions 510/512 is directly vertically adjoining for the channel regions 506 in that epitaxial growth is on and between nanowire portions extending beyond the channel regions 506, where nanowire ends are shown within the source or drain structures. In another embodiment, as depicted in FIG. 5A, the pair of non-discrete source or drain regions 510/512 is indirectly vertically adjoining for the channel regions 506 in that they are formed at the ends of the nanowires and not between the nanowires.

In an embodiment, as depicted, the source or drain regions 510/512 are non-discrete in that there are not individual and discrete source or drain regions for each channel region 506 of a nanowire 504. Accordingly, in embodiments having a plurality of nanowires 504, the source or drain regions 510/512 of the nanowires are global or unified source or drain regions as opposed to discrete for each nanowire. In one embodiment, from a cross-sectional perspective orthogonal to the length of the discrete channel regions 506, each of the pair of non-discrete source or drain regions 510/512 is approximately rectangular in shape with a bottom tapered portion and a top vertex portion, as depicted in FIG. 5B. In other embodiments, however, the source or drain regions 510/512 of the nanowires are relatively larger yet discrete non-vertically merged epitaxial structures.

In accordance with an embodiment of the present disclosure, and as depicted in FIGS. 5A and 5B, integrated circuit structure 500 further includes a pair of contacts 514, each contact 514 on one of the pair of non-discrete source or drain regions 510/512. In one such embodiment, in a vertical sense, each contact 514 completely surrounds the respective non-discrete source or drain region 510/512. In another aspect, the entire perimeter of the non-discrete source or drain regions 510/512 may not be accessible for contact with contacts 514, and the contact 514 thus only partially surrounds the non-discrete source or drain regions 510/512, as depicted in FIG. 5B. In a contrasting embodiment, not depicted, the entire perimeter of the non-discrete source or drain regions 510/512, as taken along the a-a' axis, is surrounded by the contacts 514.

Referring to FIGS. 5B and 5C, the non-discrete source or drain regions 510/512 are global in the sense that a single unified feature is used as a source or drain region for a plurality (in this case, 3) of nanowires 504 and, more particularly, for more than one discrete channel region 506. In an embodiment, the pair of non-discrete source or drain regions 510/512 is composed of a semiconductor material different than the semiconductor material of the discrete channel regions 506, e.g., the pair of non-discrete source or drain regions 510/512 is composed of a silicon germanium while the discrete channel regions 506 are composed of silicon. In another embodiment, the pair of non-discrete source or drain regions 510/512 is composed of a semiconductor material the same or essentially the same as the semiconductor material of the discrete channel regions 506, e.g., both the pair of non-discrete source or drain regions 510/512 and the discrete channel regions 506 are composed of silicon.

Referring again to FIG. 5A, in an embodiment, integrated circuit structure 500 further includes a pair of spacers 516. As is depicted, outer portions of the pair of spacers 516 may overlap portions of the non-discrete source or drain regions 510/512, providing for "embedded" portions of the non-discrete source or drain regions 510/512 beneath the pair of spacers 516. As is also depicted, the embedded portions of the non-discrete source or drain regions 510/512 may not extend beneath the entirety of the pair of spacers 516.

Substrate 502 may be composed of a material suitable for integrated circuit structure fabrication. In one embodiment, substrate 502 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 500 may be fabricated from a starting semiconductor-on-insulator substrate. Alternatively, the structure 500 is formed directly from a bulk substrate and local oxidation is used to form electrically insulative portions in place of the above described upper insulator layer. In another alternative embodiment, the structure 500 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 504 may be sized as wires or ribbons, as described below, and may have squared-off or rounder corners. In an embodiment, the nanowires 504 are composed of a material such as, but not limited to, silicon, germanium, or a combination thereof. In one such embodiment, the nanowires are single-crystalline. For example, for a silicon nanowire 504, a single-crystalline nanowire may be based from a (100) global orientation, e.g., with a <100> plane in the z-direction. As described below, other orientations may also be considered. In an embodiment, the dimensions of the nanowires 504, from a cross-sectional perspective, are on the nano-scale. For example, in a specific embodiment, the smallest dimension of the nanowires 504 is less than approximately 20 nanometers. In an embodiment, the nanowires 504 are composed of a strained material, particularly in the channel regions 506.

Referring to FIGS. 5C, in an embodiment, each of the channel regions 506 has a width (Wc) and a height (Hc), the width (Wc) approximately the same as the height (Hc). That is, in both cases, the channel regions 506 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 6A-6E illustrate three-dimensional cross-sectional views representing various operations in a method of fabricating a nanowire portion of a fin/nanowire structure, in accordance with an embodiment of the present disclosure. It is to be appreciated that, for clarity, a laterally neighboring integrated circuit structure and an intervening dielectric structure implemented between confined and separated neighboring source or drain regions are not depicted in association with FIGS. 6A-6E, however such a structure would be at a location into the page, for example.

Figure 6A:
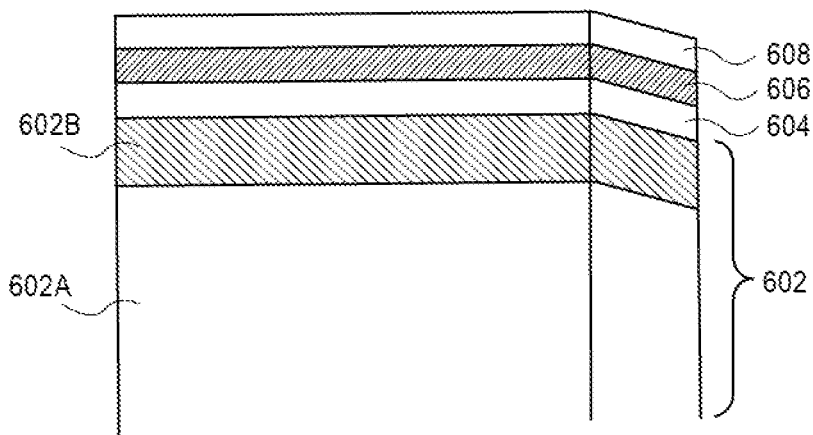
FIGS. 6A-6E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 6A illustrates a substrate 602 (e.g., composed of a bulk substrate silicon substrate 602A with an insulating silicon dioxide layer 602B there on) having a silicon layer 604/silicon germanium layer 606/silicon layer 608 stack thereon. It is to be appreciated that, in another embodiment, a silicon germanium layer/silicon layer/silicon germanium layer stack may be used to ultimately form two silicon germanium nanowires.

Figure 6B:
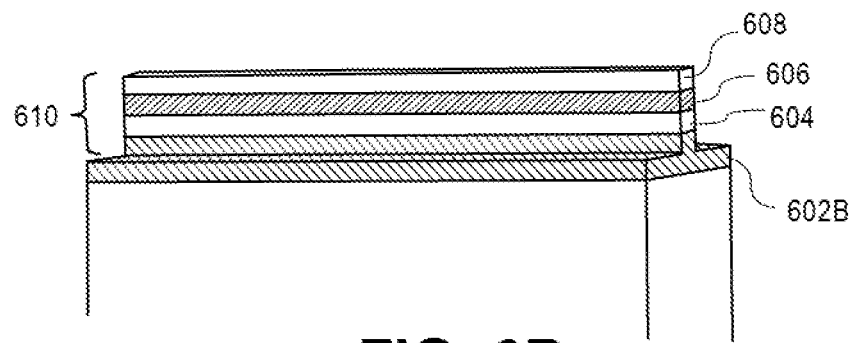

Referring to FIG. 6B, a portion of the silicon layer 604/silicon germanium layer 606/silicon layer 608 stack as well as a top portion of the silicon dioxide layer 602B is patterned into a fin-type structure 610, e.g., with a mask and plasma etch process. It is to be appreciated that, for illustrative purposes, the etch for FIG. 6B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 5.

Figure 6C:
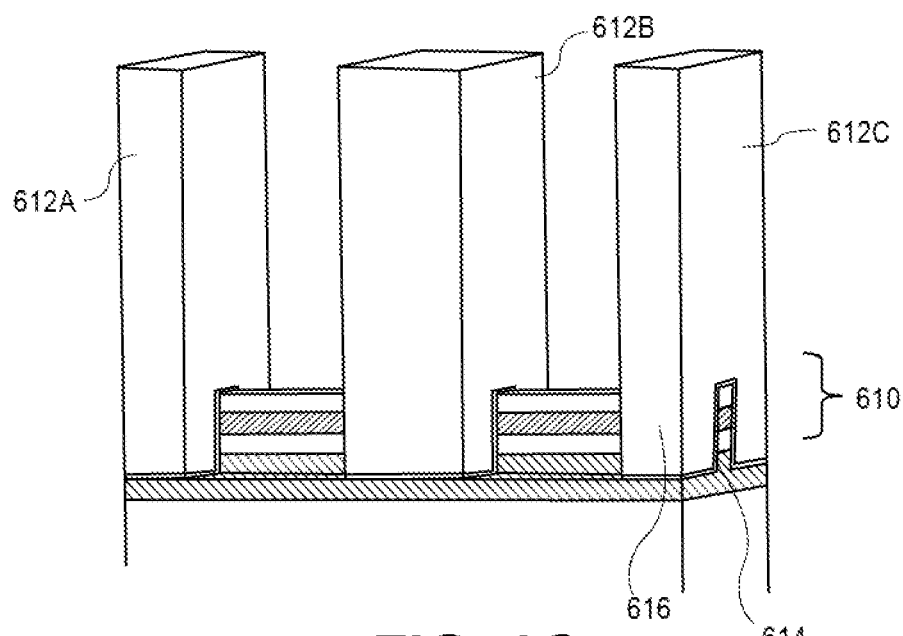

The method may also include forming a channel region in the nanowire, the channel region having a length and a perimeter orthogonal to the length. In a specific example showing the formation of three gate structures over the two silicon nanowires, FIG. 6C illustrates the fin-type structure 610 with three sacrificial gates 612A, 612B, and 612C thereon. In one such embodiment, the three sacrificial gates 612A, 612B, and 612C are composed of a sacrificial gate oxide layer 614 and a sacrificial polysilicon gate layer 616 which are blanket deposited and patterned with a plasma etch process.

Following patterning to form the three sacrificial gates 612A, 612B, and 612C, spacers may be formed on the sidewalls of the three sacrificial gates 612A, 612B, and

Figure 6D:
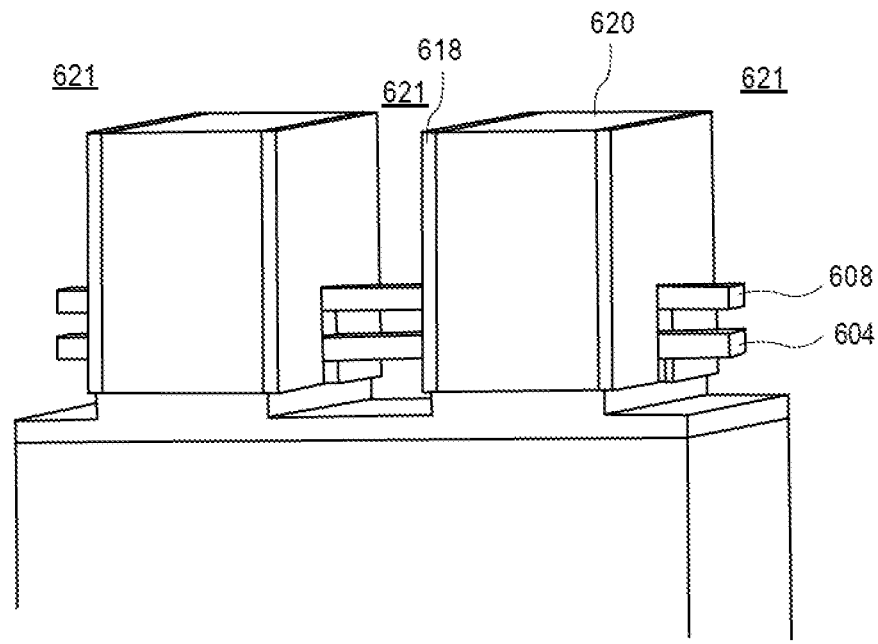

612C, doping may be performed (e.g., tip and/or source and drain type doping), and an interlayer dielectric layer may be formed to cover the three sacrificial gates 612A, 612B, and 612C. The interlayer dielectric layer may be polished to expose the three sacrificial gates 612A, 612B, and 612C for a replacement gate, or gate-last, process. Referring to FIG. 6D, the three sacrificial gates 612A, 612B, and 612C have been removed, leaving spacers 618 and a portion of the interlayer dielectric layer 620 remaining.

Additionally, referring again to FIG. 6D the portions of the silicon germanium layer 606 and the portion of the insulating silicon dioxide layer 602B of the fin structure 610 are removed in the regions originally covered by the three sacrificial gates 612A, 612B, and 612C. Discrete portions of the silicon layers 604 and 608 thus remain, as depicted in FIG. 6D.

The discrete portions of the silicon layers 604 and 608 shown in FIG. 6D will, in one embodiment, ultimately become channel regions in a nanowire-based device. Thus, at the process stage depicted in FIG. 6D, channel engineering or tuning may be performed. For example, in one embodiment, the discrete portions of the silicon layers 604 and 608 shown in FIG. 6D are thinned using oxidation and etch processes. Such an etch process may be performed at the same time the wires are separated by etching the silicon germanium layer 606. Accordingly, the initial wires formed from silicon layers 604 and 608 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 6E:
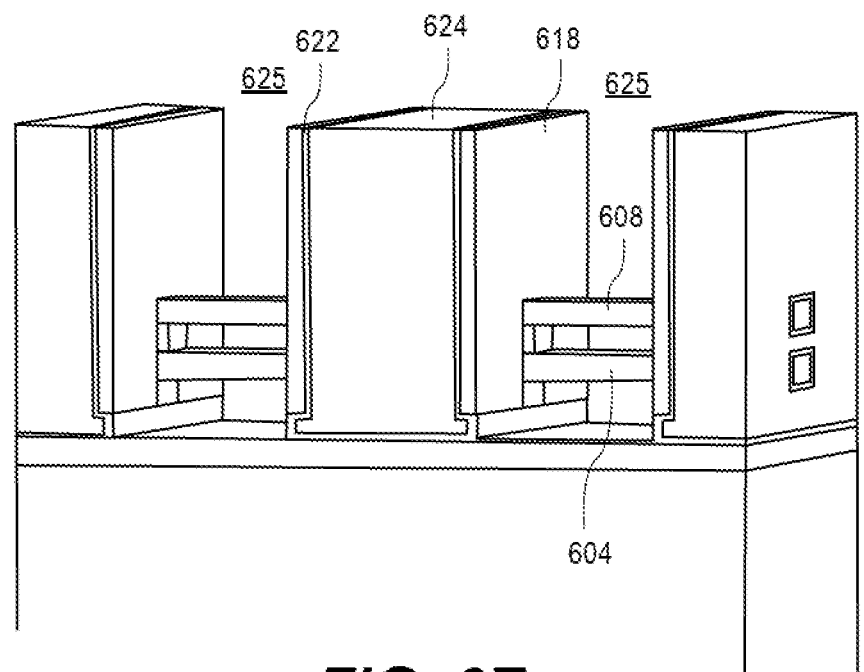

The method may also include forming a gate electrode stack surrounding the entire perimeter of the channel region. In the specific example showing the formation of three gate structures over the two silicon nanowires, FIG. 6E illustrates the structure following deposition of a gate dielectric layer 622 (such as a high-k gate dielectric layer) and a gate electrode layer 624 (such as a metal gate electrode layer), and subsequent polishing, in between the spacers 618. That is, gate structures are formed in the trenches 621 of FIG. 6D. Additionally, FIG. 6E depicts the result of the subsequent removal of the interlayer dielectric layer 620 after formation of the permanent gate stack. The portions of the silicon germanium layer 606 and the portion of the insulating silicon dioxide layer 602B of the fin structure 610 are also removed in the regions originally covered by the portion of the interlayer dielectric layer 620 depicted in FIG. 6D. Discrete portions of the silicon layers 604 and 608 thus remain, as depicted in FIG. 6E.

The method may also include forming a pair of source and drain regions in the nanowire, on either side of the channel region, each of the source and drain regions having a perimeter orthogonal to the length of the channel region. Specifically, the discrete portions of the silicon layers 604 and 608 shown in FIG. 6E will, in one embodiment, ultimately become at least a portion of the source and drain regions in a nanowire-based device. In one such embodiment, epitaxial source or drain structures are formed by merging epitaxial material around existing nanowires 604 and 608. In another embodiment, epitaxial source or drain structures are embedded, e.g., portions of nanowires 604 and 608 are removed and then source or drain (S/D) growth is performed. In either case, in accordance with an embodiment of the present disclosure, such epitaxial source or drain structures are confined and separated from corresponding epitaxial source or drain structures from a neighboring device, as exemplified in association with FIGS. 3A-3H and/or 4A-4E.

The method may subsequently include forming a pair of contacts, a first of the pair of contacts completely or nearly completely surrounding the perimeter of the source region, and a second of the pair of contacts completely or nearly completely surrounding the perimeter of the drain region. Specifically, contacts are formed in the trenches 625 of FIG. 6E following epitaxial growth and recess. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

In an embodiment, as described throughout, gate structures may be composed of a gate electrode stack which includes a gate dielectric layer and a gate electrode layer. In an embodiment, the gate electrode of the gate electrode stack is composed of a metal gate and the gate dielectric layer includes a high-k material.

In an embodiment, the gate dielectric of region is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a corresponding substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, a gate dielectric of region includes a layer of non-native silicon oxide in addition to a layer of high-k material. The layer of non-native silicon oxide may be formed using a CVD process and may be formed below or above the layer of high-k material. In an exemplary embodiment, a layer of non-native silicon oxide is formed beneath a layer of high-k material.

In an embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as described throughout, local interconnects, gate contacts, overlying gate contact vias, and overlying metal interconnects may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), a contact pattern which is essentially perfectly aligned to an existing gate pattern is formed while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate structures described herein may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to fabricate an integrated circuit structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, an integrated circuit structure has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for integrated circuit structure or semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
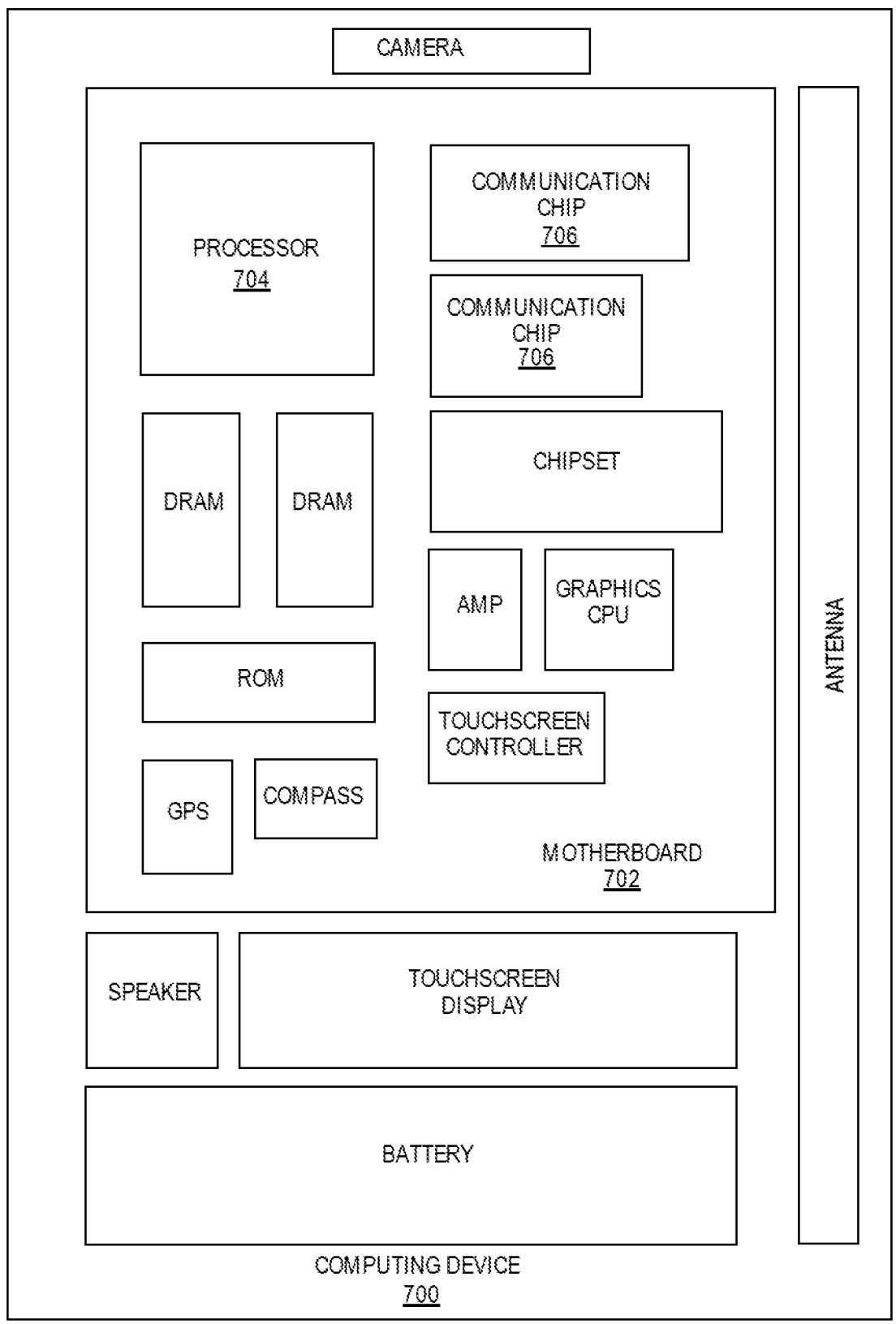
FIG. 7 illustrates a computing device in accordance with one implementation of an embodiment of the disclosure.

FIG. 7 illustrates a computing device 700 in accordance with one implementation of an embodiment of the present disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The integrated circuit die of the processor 704 may include one or more structures, such as integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. The integrated circuit die of the communication chip 706 may include one or more structures, such as integrated circuit structures built in accordance with implementations of embodiments of the present disclosure.

In further implementations, another component housed within the computing device 700 may contain an integrated circuit die that includes one or structures, such as integrated circuit structures built in accordance with implementations of embodiments of the present disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
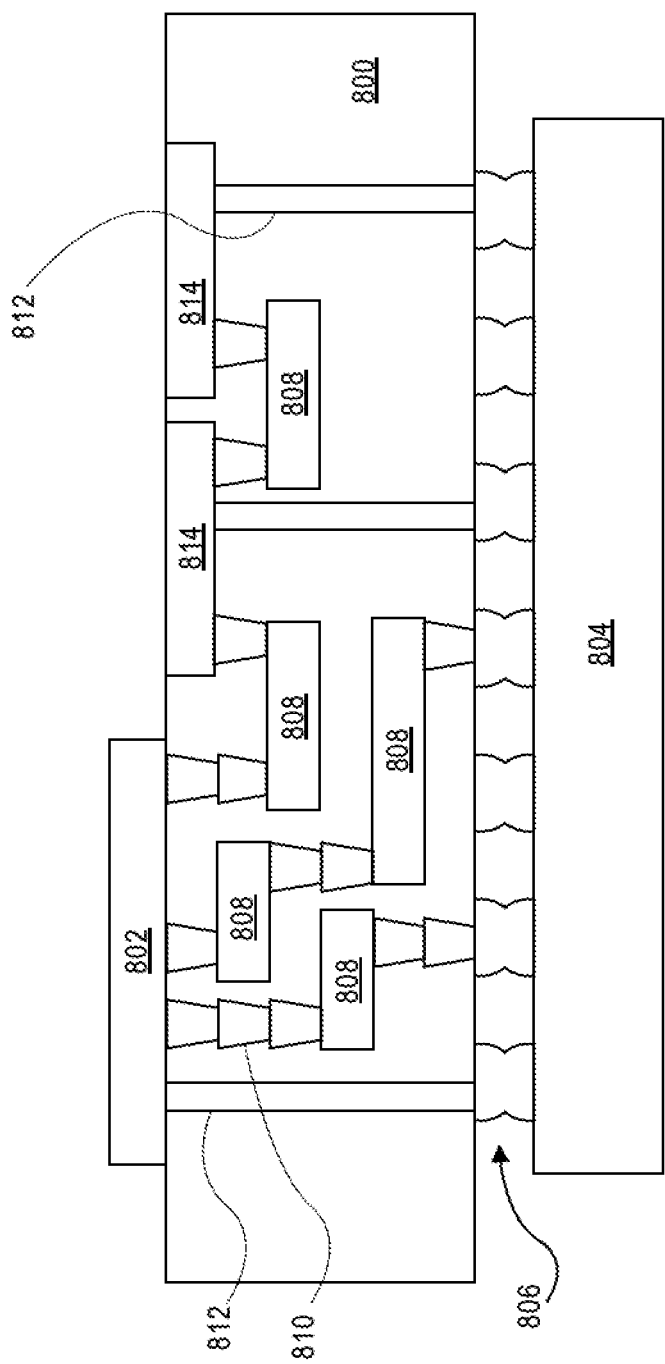
FIG. 8 illustrates an interposer that includes one or more embodiments of the disclosure.

FIG. 8 illustrates an interposer 800 that includes one or more embodiments of the present disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800 or in the fabrication of components included in the interposer 800.

Thus, embodiments of the present disclosure include gate-all-around integrated circuit structures having epitaxial source or drain region lateral isolation, and methods of fabricating gate-all-around integrated circuit structures having epitaxial source or drain region lateral isolation.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first vertical arrangement of nanowires and a second vertical arrangement of nanowires. A gate stack is over the first and second vertical arrangements of nanowires. First epitaxial source or drain structures are at ends of the first vertical arrangement of nanowires. Second epitaxial source or drain structures are at ends of the second vertical arrangement of nanowires. An intervening dielectric structure is between neighboring ones of the first epitaxial source or drain structures and the second epitaxial source or drain structures. The intervening dielectric structure has a top surface co-planar with a top surface of the gate structure.

Example embodiment 2: The integrated circuit structure of example embodiment 1, wherein the intervening dielectric structure is on a top surface of a shallow trench isolation (STI) structure.

Example embodiment 3: The integrated circuit structure of example embodiment 2, wherein the intervening dielectric structure includes a dielectric material having a lower dielectric constant than the STI structure.

Example embodiment 4: The integrated circuit structure of example embodiment 1, 2 or 3, wherein the first epitaxial source or drain structures and the second epitaxial source or drain structures are each non-discrete epitaxial source or drain structures.

Example embodiment 5: The integrated circuit structure of example embodiment 1, 2, 3 or 4, wherein the first vertical arrangement of nanowires is over a first sub-fin, and the second vertical arrangement of nanowires is over a second sub-fin.

Example embodiment 6: An integrated circuit structure includes a first fin and a second fin. A gate stack is over the first and second fins. First epitaxial source or drain structures are at ends of the first fin. Second epitaxial source or drain structures are at ends of the second fin. An intervening dielectric structure is between neighboring ones of the first epitaxial source or drain structures and the second epitaxial source or drain structures. The intervening dielectric structure has a top surface co-planar with a top surface of the gate structure.

Example embodiment 7: The integrated circuit structure of example embodiment 6, wherein the intervening dielectric structure is on a top surface of a shallow trench isolation (STI) structure.

Example embodiment 8: The integrated circuit structure of example embodiment 7, wherein the intervening dielectric structure includes a dielectric material having a lower dielectric constant than the STI structure.

Example embodiment 9: The integrated circuit structure of example embodiment 6, 7 or 8, wherein the first epitaxial source or drain structures and the second epitaxial source or drain structures are each non-discrete epitaxial source or drain structures.

Example embodiment 10: The integrated circuit structure of example embodiment 6, 7, 8 or 9, wherein the first fin is over a first sub-fin, and the second fin is over a second sub-fin.

Example embodiment 11: A computing device includes a board and a component coupled to the board. The component includes an integrated circuit structure including a first fin and a second fin. A gate stack is over the first and second vertical arrangements of nanowires. First epitaxial source or drain structures are at ends of the first fin. Second epitaxial source or drain structures are at ends of the second fin. An intervening dielectric structure is between neighboring ones of the first epitaxial source or drain structures and the second epitaxial source or drain structures. The intervening dielectric structure has a top surface co-planar with a top surface of the gate structure.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, further including a battery coupled to the board.

Example embodiment 15: The computing device of example embodiment 11, 12, 13 or 14, wherein the component is a packaged integrated circuit die.

Example embodiment 16: A computing device includes a board and a component coupled to the board. The component includes an integrated circuit structure including a first fin and a second fin. A gate stack is over the first and second fins. First epitaxial source or drain structures are at ends of the first fin. Second epitaxial source or drain structures are at ends of the second fin. An intervening dielectric structure is between neighboring ones of the first epitaxial source or drain structures and the second epitaxial source or drain structures. The intervening dielectric structure has a top surface co-planar with a top surface of the gate structure.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, further including a battery coupled to the board.

Example embodiment 20: The computing device of example embodiment 16, 17, 18 or 19, wherein the component is a packaged integrated circuit die.

What is claimed is:

1. An integrated circuit structure, comprising:
    a first vertical arrangement of nanowires and a second vertical arrangement of nanowires;
    a gate stack over the first and second vertical arrangements of nanowires;
    first epitaxial source or drain structures at ends of the first vertical arrangement of nanowires;
    second epitaxial source or drain structures at ends of the second vertical arrangement of nanowires; and
    an intervening dielectric structure between and in direct contact with neighboring ones of the first epitaxial source or drain structures and the second epitaxial source or drain structures, the intervening dielectric structure having a top surface co-planar with a top surface of the gate structure.

2. The integrated circuit structure of claim 1, wherein the intervening dielectric structure is on a top surface of a shallow trench isolation (STI) structure.

3. The integrated circuit structure of claim 1, wherein the intervening dielectric structure comprises a dielectric material having a lower dielectric constant than the STI structure.

4. The integrated circuit structure of claim 1, wherein the first epitaxial source or drain structures and the second epitaxial source or drain structures are each non-discrete epitaxial source or drain structures.

5. The integrated circuit structure of claim 1, wherein the first vertical arrangement of nanowires is over a first sub-fin, and the second vertical arrangement of nanowires is over a second sub-fin.

6. A computing device, comprising:
    a board; and
    a component coupled to the board, the component including an integrated circuit structure, comprising:
        a first vertical arrangement of nanowires and a second vertical arrangement of nanowires;
        a gate stack over the first and second vertical arrangements of nanowires;
        first epitaxial source or drain structures at ends of the first vertical arrangement of nanowires;
        second epitaxial source or drain structures at ends of the second vertical arrangement of nanowires; and
        an intervening dielectric structure between and in direct contact with neighboring ones of the first epitaxial source or drain structures and the second epitaxial source or drain structures, the intervening dielectric structure having a top surface co-planar with a top surface of the gate structure.

7. The computing device of claim 6, further comprising: a memory coupled to the board.

8. The computing device of claim 6, further comprising: a communication chip coupled to the board.

9. The computing device of claim 6, further comprising: a battery coupled to the board.

10. The computing device of claim 6, wherein the component is a packaged integrated circuit die.

* * * * *